United States Patent
Yang et al.

(10) Patent No.: US 8,044,759 B2
(45) Date of Patent: Oct. 25, 2011

(54) OVERLAPPING COMPACT MULTIPLE TRANSFORMERS

(75) Inventors: Ki Seok Yang, Atlanta, GA (US);
Jeonghu Han, Atlanta, GA (US);
Jaejoon Chang, Duluth, GA (US);
Woonyun Kim, Johns Creek, GA (US);
Chang-Ho Lee, Marietta, GA (US)

(73) Assignees: Samsung Electro-Mechanics, Gyunggi-Do (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/902,940

(22) Filed: Oct. 12, 2010

(65) Prior Publication Data
US 2011/0043316 A1   Feb. 24, 2011

Related U.S. Application Data

(63) Continuation-in-part of application No. 11/970,995, filed on Jan. 8, 2008, now Pat. No. 7,812,701.

(51) Int. Cl.
*H01F 5/00* (2006.01)
(52) U.S. Cl. ............................................. 336/200
(58) Field of Classification Search ............ 336/65, 336/200, 232, 180–184, 173, 170; 330/295, 330/195, 124 R
See application file for complete search history.

(56) References Cited

U.S. PATENT DOCUMENTS

| | | |
|---|---|---|
| 2,710,312 A | 6/1955 | Hafler et al. |
| 3,060,266 A | 10/1962 | Dow |
| 4,105,941 A | 8/1978 | Routh |
| 4,994,760 A | 2/1991 | Roehrs |
| 5,091,703 A | 2/1992 | Schenk |
| 5,319,342 A * | 6/1994 | Kuroki ........................ 336/170 |
| 5,543,773 A | 8/1996 | Evans et al. |
| 5,659,461 A * | 8/1997 | Inou et al. ................ 363/21.16 |
| 5,796,165 A | 8/1998 | Yoshikawa et al. |
| 5,974,041 A | 10/1999 | Kornfeld et al. |

(Continued)

FOREIGN PATENT DOCUMENTS

EP       1677415 A1     5/2006
(Continued)

OTHER PUBLICATIONS

Combined Search and Examination Report dated Apr. 30, 2009 for Application No. GB0823679.6.

(Continued)

*Primary Examiner* — Tuyen Nguyen
(74) *Attorney, Agent, or Firm* — Sutherland Asbill & Brennan LLP

(57) ABSTRACT

Systems and methods are provided for overlapping compact multiple transformers. The systems and methods may include a first transformer section that includes a first primary winding section and a first secondary winding, where the first primary winding section is inductively coupled to the first secondary winding, where the first transformer section is associated with a first rotational current flow direction in the first primary winding section; and a second transformer section that includes a second primary winding section and a second secondary winding, where the second primary winding section is inductively coupled to the second secondary winding, wherein the second transformer section is associated with a second rotational current flow direction in the second primary winding section, where a first portion of the first primary winding section is adjacent to a second portion of the second primary winding section, where the adjacent first and second portions include a substantially same first linear current flow direction.

20 Claims, 15 Drawing Sheets

U.S. PATENT DOCUMENTS

| | | | |
|---|---|---|---|
| 6,097,250 A * | 8/2000 | Kamali et al. | 330/124 R |
| 6,097,273 A | 8/2000 | Frye et al. | |
| 6,323,686 B1 | 11/2001 | Bisson et al. | |
| 6,396,362 B1 | 5/2002 | Mourant et al. | |
| 6,462,950 B1 | 10/2002 | Pohjonen | |
| 6,466,094 B2 | 10/2002 | Leighton et al. | |
| 6,476,704 B2 | 11/2002 | Goff | |
| 6,577,219 B2 | 6/2003 | Visser | |
| 6,614,308 B2 | 9/2003 | Moller et al. | |
| 6,674,632 B2 | 1/2004 | Kiewitt et al. | |
| 6,731,166 B1 | 5/2004 | Sabouri et al. | |
| 6,737,916 B2 | 5/2004 | Luu | |
| 6,798,295 B2 | 9/2004 | Pengelly et al. | |
| 6,818,979 B2 | 11/2004 | Takehara et al. | |
| 6,882,263 B2 | 4/2005 | Yang et al. | |
| 6,885,275 B1 | 4/2005 | Chang | |
| 7,061,329 B2 | 6/2006 | Inoue et al. | |
| 7,091,791 B1 | 8/2006 | Terrovitis | |
| 7,091,813 B2 | 8/2006 | Liang et al. | |
| 7,092,678 B2 | 8/2006 | Shih | |
| 7,129,784 B2 | 10/2006 | Bhatti et al. | |
| 7,157,965 B1 | 1/2007 | Kim | |
| 7,157,966 B2 | 1/2007 | Baree et al. | |
| 7,176,579 B2 | 2/2007 | Konishi et al. | |
| 7,192,788 B2 | 3/2007 | Kurokawa | |
| 7,242,245 B2 | 7/2007 | Burns et al. | |
| 7,260,152 B2 | 8/2007 | Golo | |
| 7,276,420 B2 | 10/2007 | Liu et al. | |
| 7,288,995 B2 | 10/2007 | Vaisanen | |
| 7,348,656 B2 | 3/2008 | Briere | |
| 7,365,602 B2 | 4/2008 | Bhatti et al. | |
| 7,414,507 B2 | 8/2008 | Giandalia et al. | |
| 7,425,869 B2 | 9/2008 | Aoki et al. | |
| 7,486,167 B2 | 2/2009 | Loke et al. | |
| 2006/0091958 A1 | 5/2006 | Bhatti et al. | |
| 2006/0284685 A1 | 12/2006 | Vaisanen | |
| 2007/0046371 A1 | 3/2007 | Barabash et al. | |
| 2007/0069717 A1 | 3/2007 | Cheung et al. | |
| 2008/0164941 A1 | 7/2008 | Lee et al. | |
| 2008/0284553 A1 | 11/2008 | Lim et al. | |

FOREIGN PATENT DOCUMENTS

| | | |
|---|---|---|
| GB | 2269057 A | 1/1994 |
| GB | 2445677 A | 7/2008 |
| JP | 2003506915 A | 2/2003 |
| WO | WO 0110053 A1 | 2/2001 |

OTHER PUBLICATIONS

Combined Search and Examination Report dated May 1, 2009 for Application No. GB0900056.3.

Search Report dated Mar. 18, 2008 for GB0800400.4.

Notice of Allowance dated Jul. 13, 2009 for U.S. Appl. No. 11/968,862.

Notice of Allowance dated Mar. 9, 2009 for U.S. Appl. No. 11/968,862.

Notice of Allowance dated Feb. 22, 2010 for U.S. Appl. No. 12/138,188.

Non-Final Office Action dated Sep. 11, 2009 for U.S. Appl. No. 12/138,188.

Notice of Allowance dated Dec. 1, 2009 for U.S. Appl. No. 11/964,646.

Non-Final Office Action dated Aug. 21, 2009 for U.S. Appl. No. 11/964,646.

Non-Final Office Action dated Feb. 27, 2009 for U.S. Appl. No. 11/964,646.

Non-Final Office Action dated Dec. 31, 2009 for U.S. Appl. No. 12/416,268.

Final Office Action dated Jan. 5, 2010 for U.S. Appl. No. 11/970,995.

Non-Final Office Action dated Jul. 8, 2009 for U.S. Appl. No. 11/970,995.

Notice of Allowance dated May 21, 2010 for U.S. Appl. No. 11/970,995.

First Office Action for Chinese Patent Application No. 200810001009.9 dated Apr. 21, 2010.

* cited by examiner

OVERLAPPING COMPACT MULTIPLE TRANSFORMERS

RELATED APPLICATION

The present application is a continuation-in-part of U.S. Non-provisional application Ser. No. 11/970,995, filed on Jan. 8, 2008, and entitled "Compact Multiple Transformers," which is hereby incorporated by reference in its entirety as if fully set forth herein.

FIELD OF INVENTION

The invention relates generally to transformers, and more particularly, to systems and methods for overlapping compact multiple transformers.

BACKGROUND OF THE INVENTION

According to the fast growth of semiconductor technology, many blocks and functions have been integrated on a chip as a System-On-Chip (SOC) technology. In the semiconductor technology, a monolithic transformer requires a significant amount of space. Moreover, the monolithic transformer requires a minimum of 50-μm spacing from other circuitry to prevent undesirable magnetic coupling or loss of magnetic flux. Accordingly, the total size of multiple transformers is large and increases manufacturing cost, chip size, and package size.

BRIEF SUMMARY OF THE INVENTION

According to an example embodiment of the invention, there may be system for multiple transformers. The system may include a first transformer section that includes a first primary winding section and a first secondary winding, wherein the first primary winding section is inductively coupled to the first secondary winding, wherein the first transformer section is associated with a first rotational current flow direction in the first primary winding section; and a second transformer section that includes a second primary winding section and a second secondary winding, wherein the second primary winding section is inductively coupled to the second secondary winding, wherein the second transformer section is associated with a second rotational current flow direction opposite the first rotational current flow direction in the second primary winding section, wherein a first portion of the first primary winding section is adjacent to a second portion of the second primary winding section, wherein the adjacent first and second portions include a substantially same first linear current flow direction.

According to another example embodiment of the invention, there may be a method for providing multiple transformers. The method may include providing a first transformer section that includes a first primary winding section and a first secondary winding, wherein the first primary winding is inductively coupled to the first secondary winding, wherein the first primary winding is coupled to one or more first input ports; receiving a first input source at the one or more first input ports to provide a first rotational current flow direction in the first primary winding; providing a second transformer section that includes a second primary winding section and a second secondary winding, wherein the second primary winding section is inductively coupled to the second secondary winding, wherein the second primary winding is coupled to one or more second input ports; receiving a second input source at the one or more second input ports to provide a second rotational current flow direction opposite the first rotational current flow direction in the second primary winding section; and positioning a first portion of the first primary winding section adjacent to a second portion of the second primary winding section, wherein the adjacent first and second portions include a substantially same first linear current flow direction.

BRIEF DESCRIPTION OF THE DRAWINGS

Figure 1A:
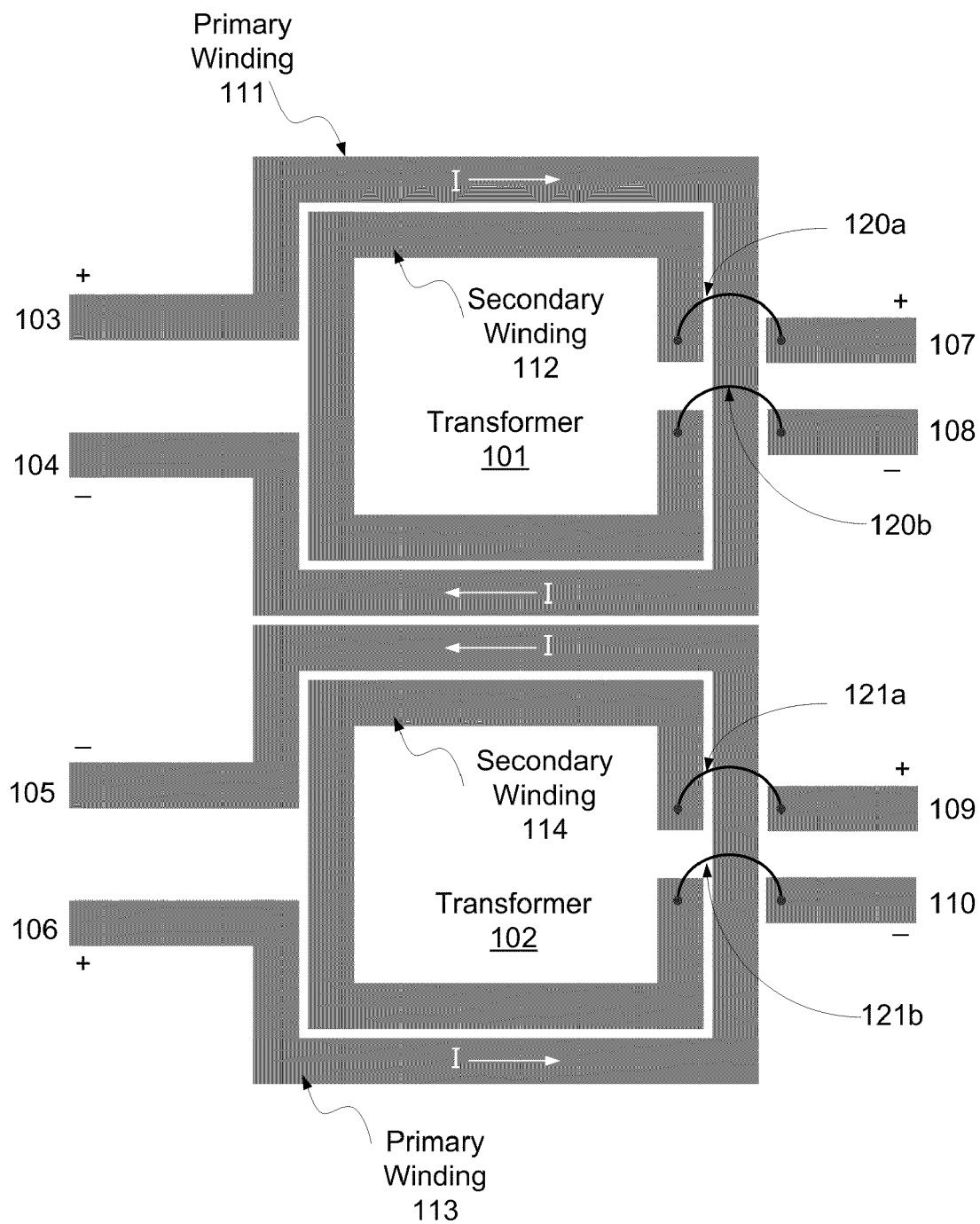
Figure 1B:
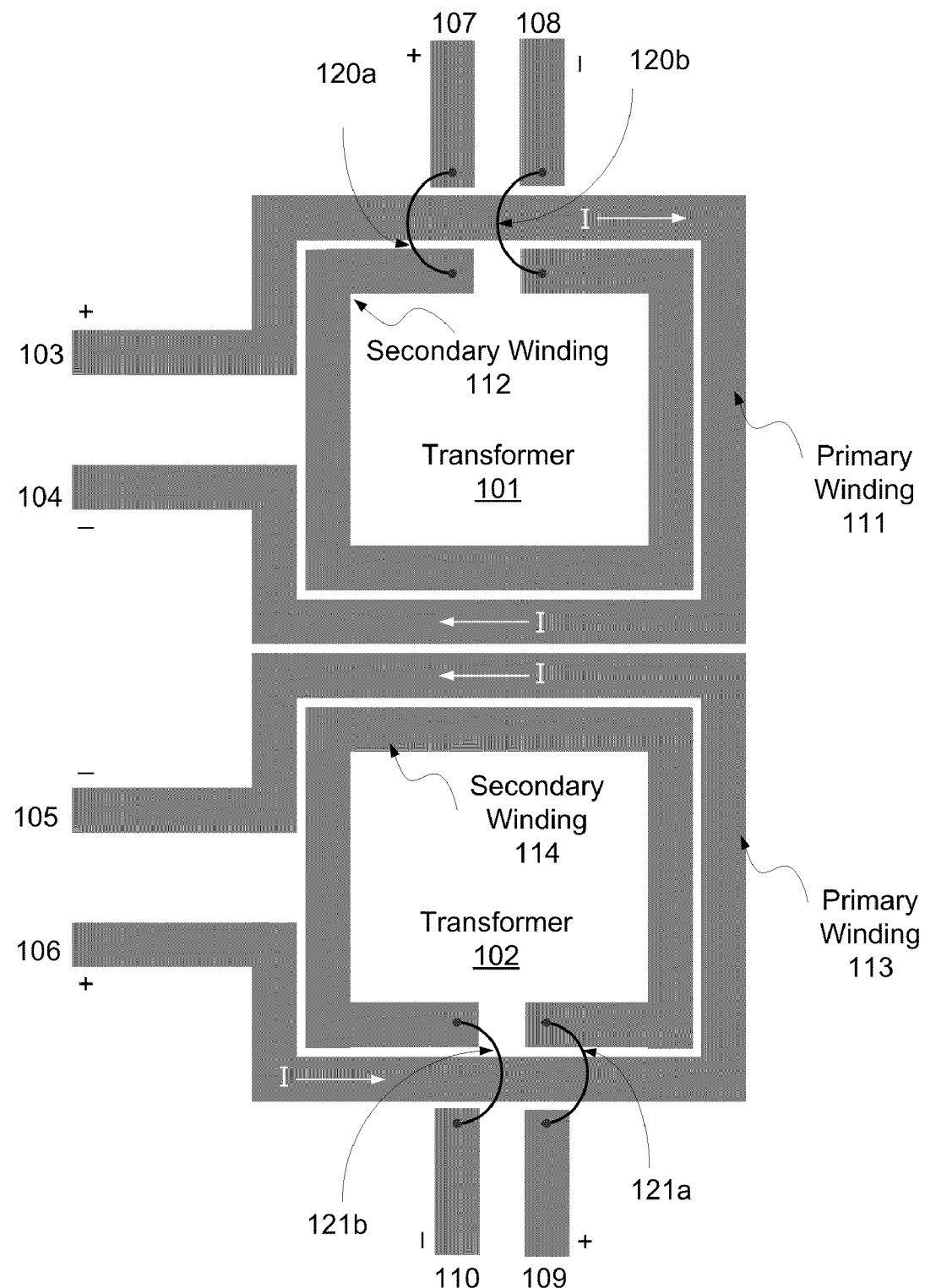
Figure 1C:
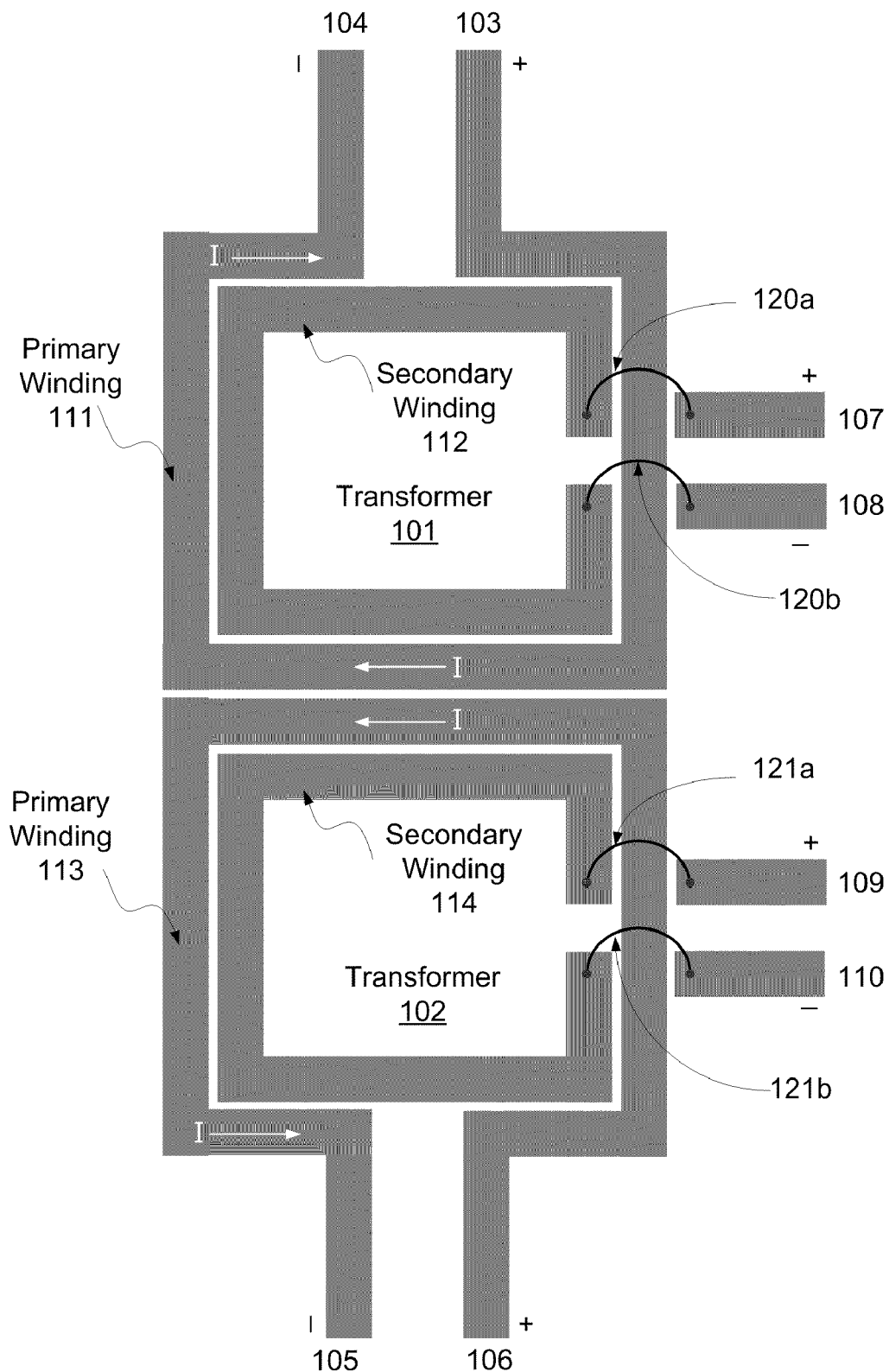

Having thus described the invention in general terms, reference will now be made to the accompanying drawings, which are not necessarily drawn to scale, and wherein:

FIGS. 1A-1C illustrates example compact multiple transformers, according to an example embodiments of the invention.

Figure 2:
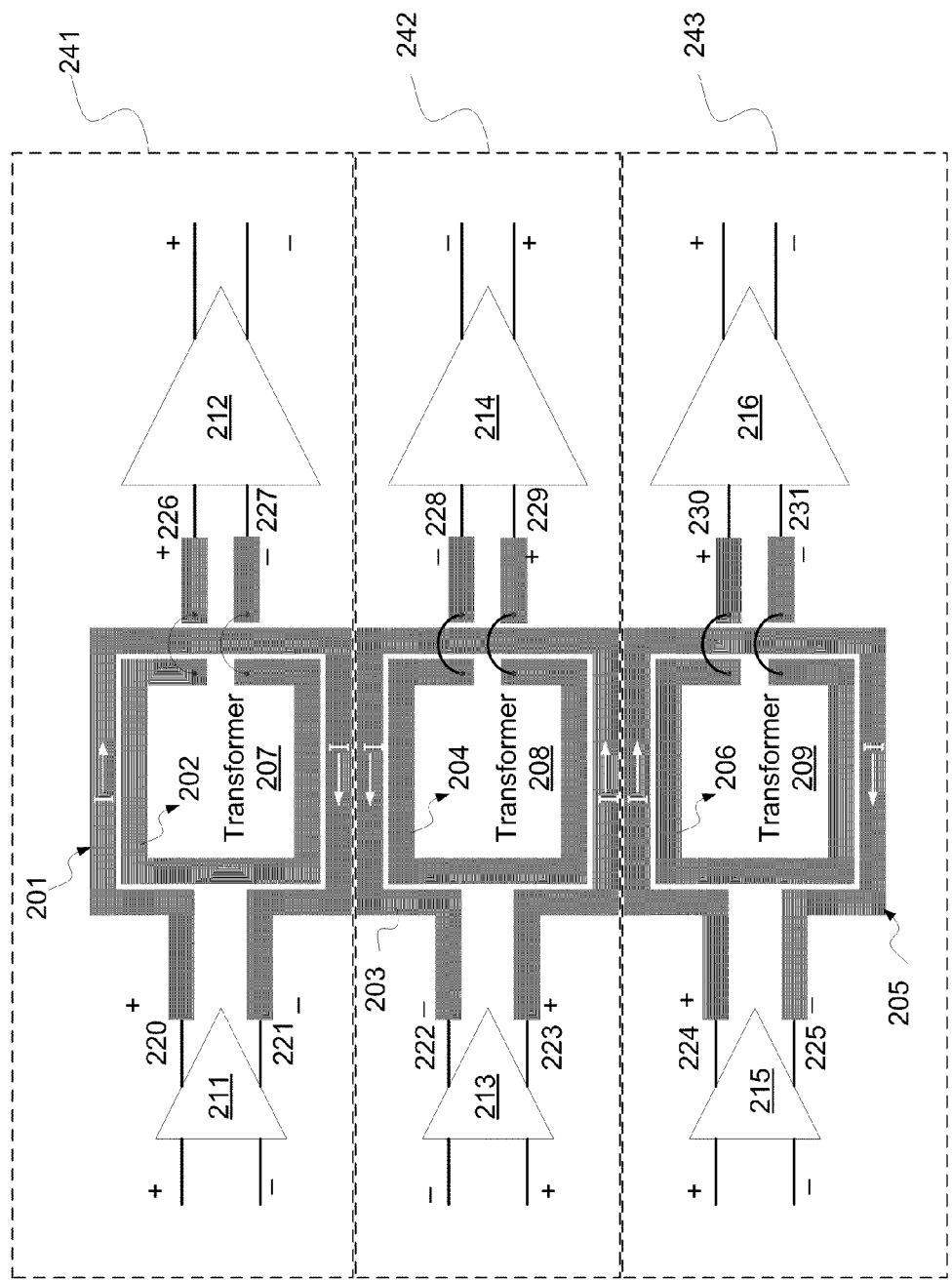

FIG. 2 illustrates an example compact multiple transformers application for parallel inter-stage networks using multiple transformers, according to an example embodiment of the invention.

Figure 3:
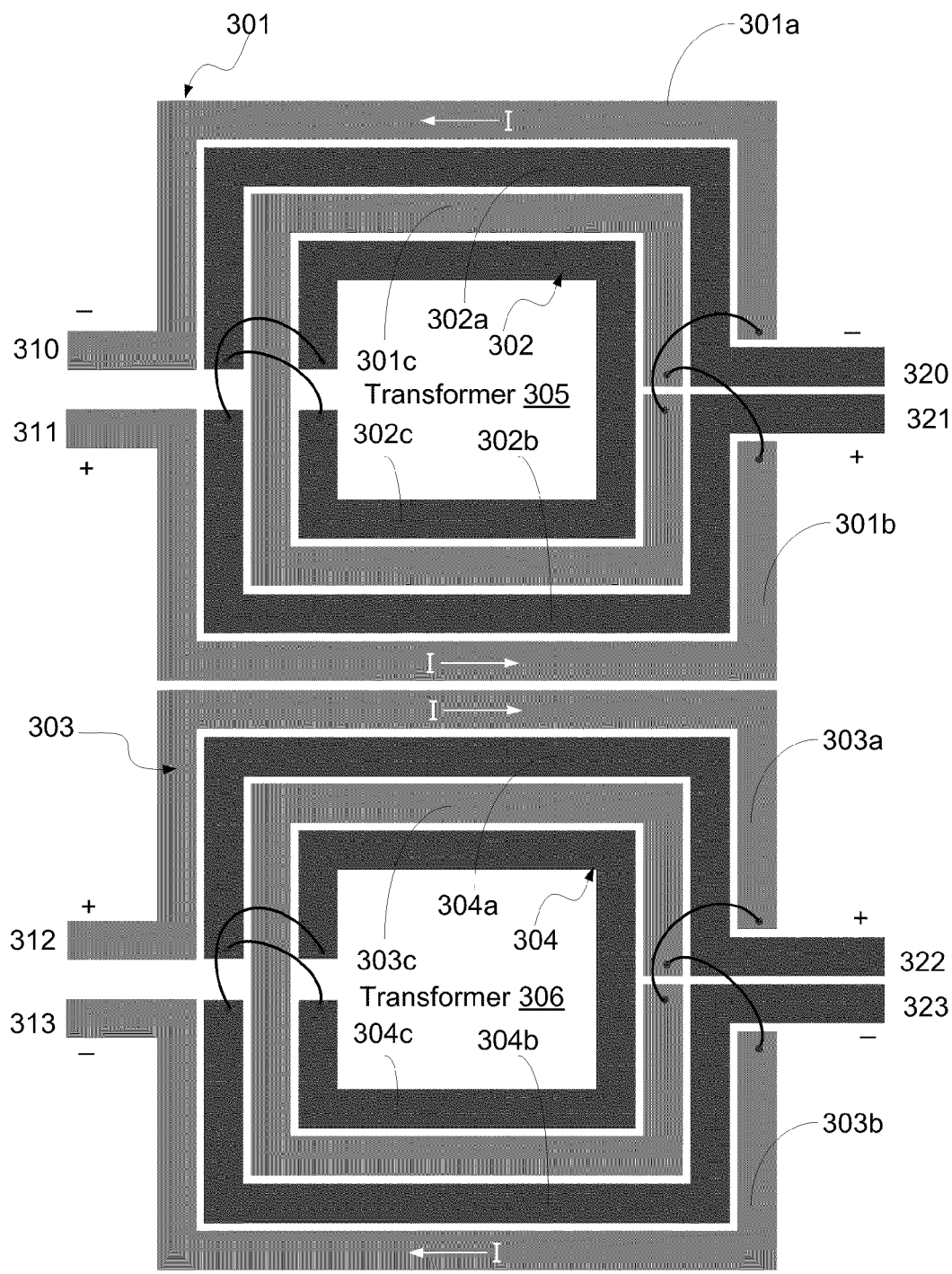

FIG. 3 illustrates example compact multiple transformers having one or more windings with multiple turns, according to an example embodiment of the invention.

Figure 4:
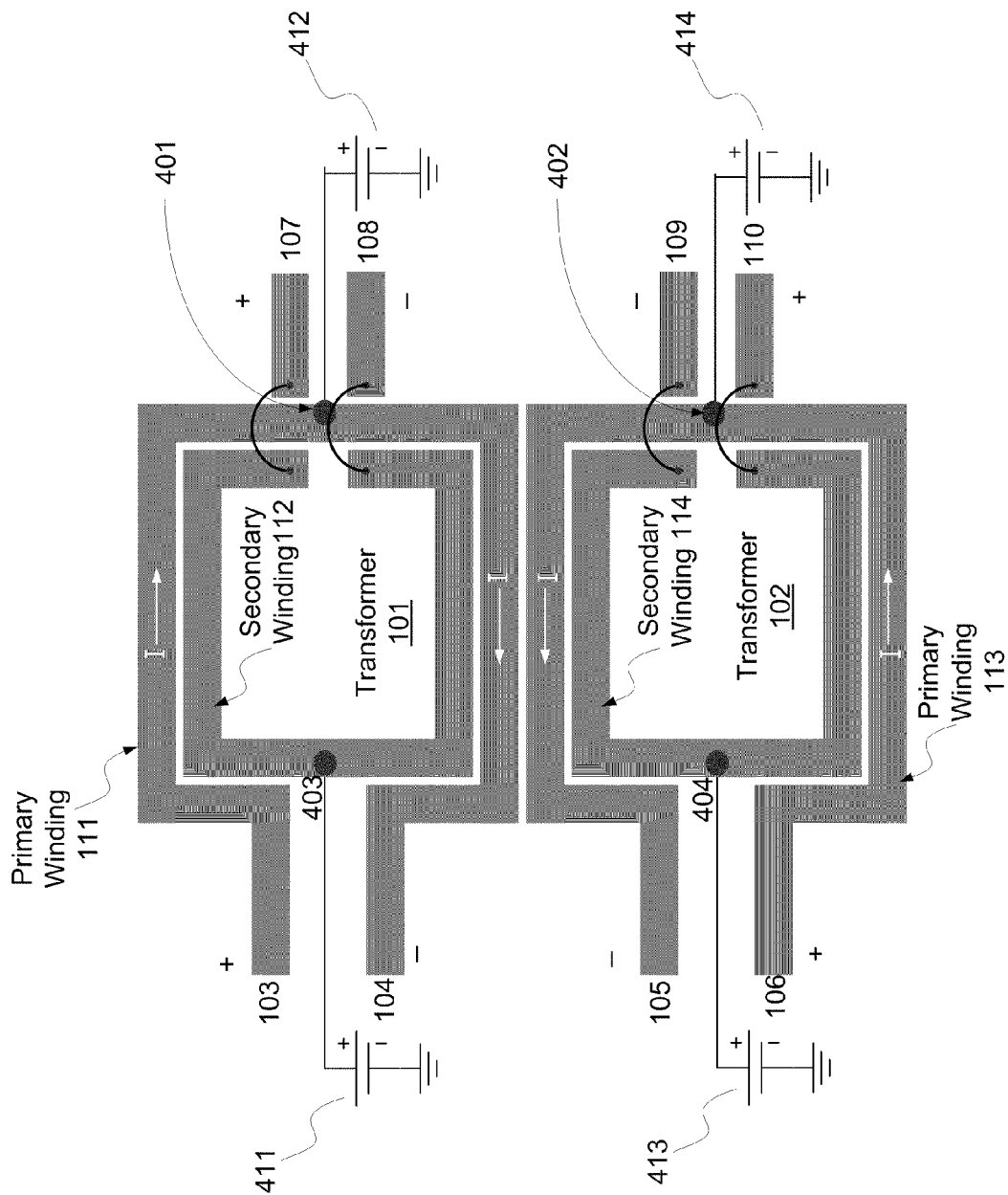

FIG. 4 illustrates example compact multiple transformers with DC biasing through center taps, according to an example embodiment of the invention.

Figure 5:
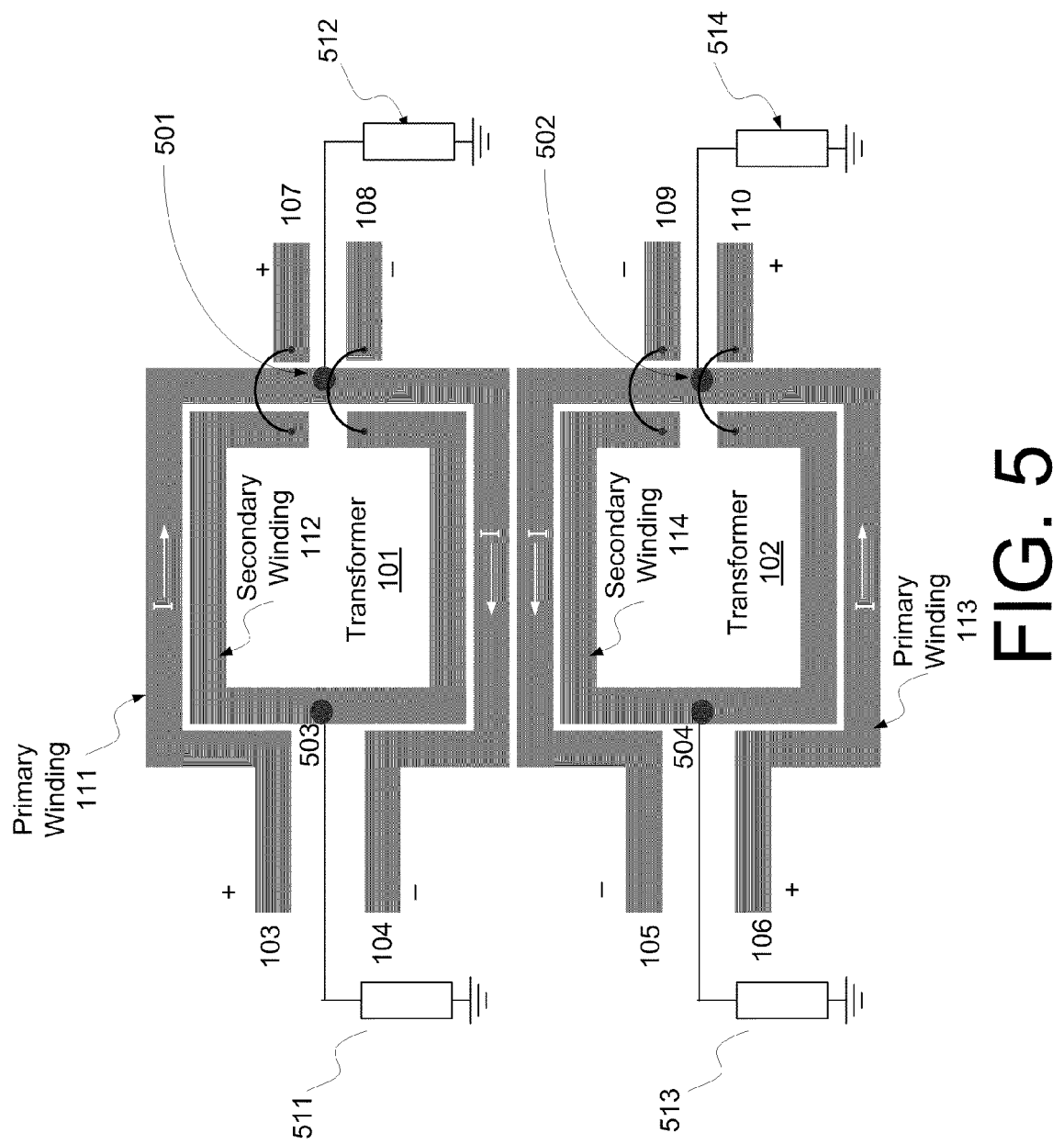

FIG. 5 illustrates example compact multiple transformers with tuning blocks through center taps, according to an example embodiment of the invention.

Figure 6C:
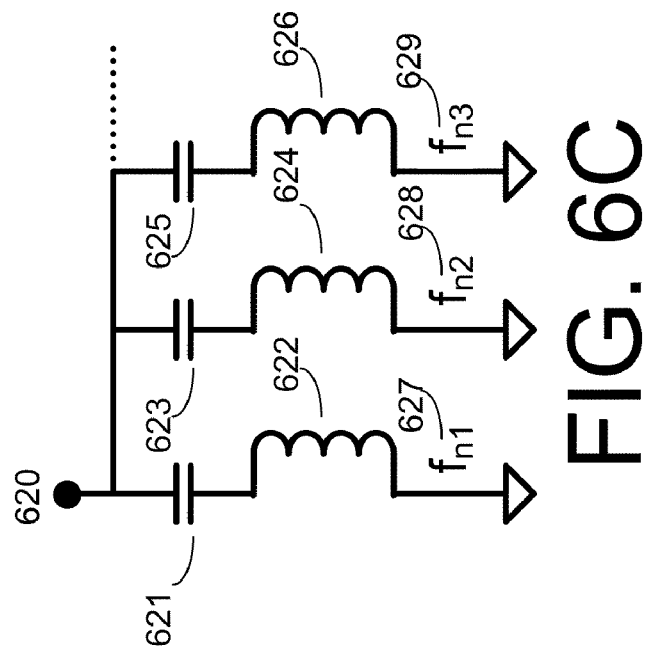
Figure 6B:
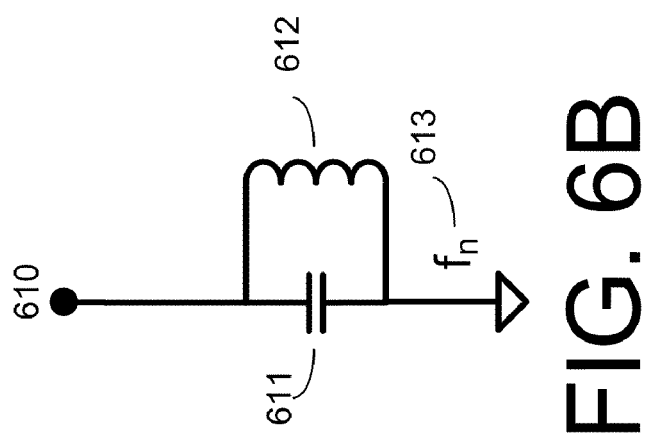
Figure 6A:
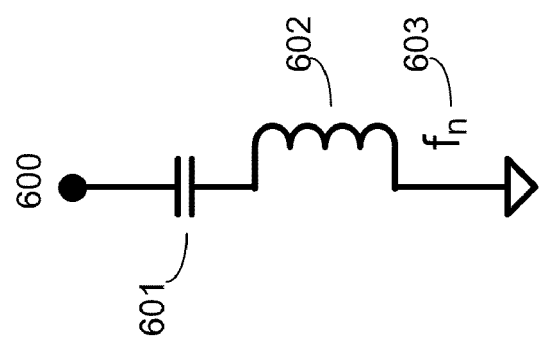

FIG. 6A-6C illustrate example schematic diagrams of example tuning blocks in accordance with example embodiments of the invention.

Figure 7:
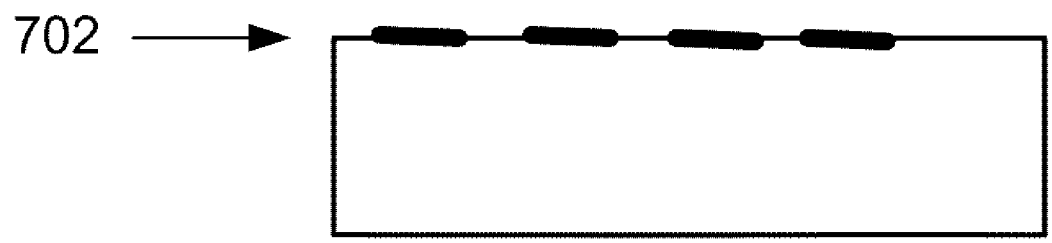

FIG. 7 illustrates an example planar structure for implementing the multiple transformers, according to an example embodiment of the invention.

Figure 8:
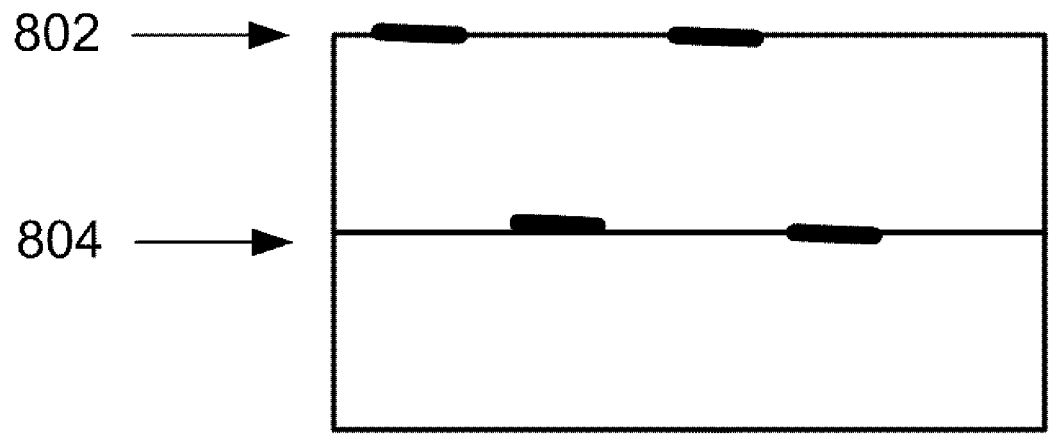

FIG. 8 illustrates an example stacked structure for implementing the multiple transformers, according to an example embodiment of the invention.

Figure 9A:
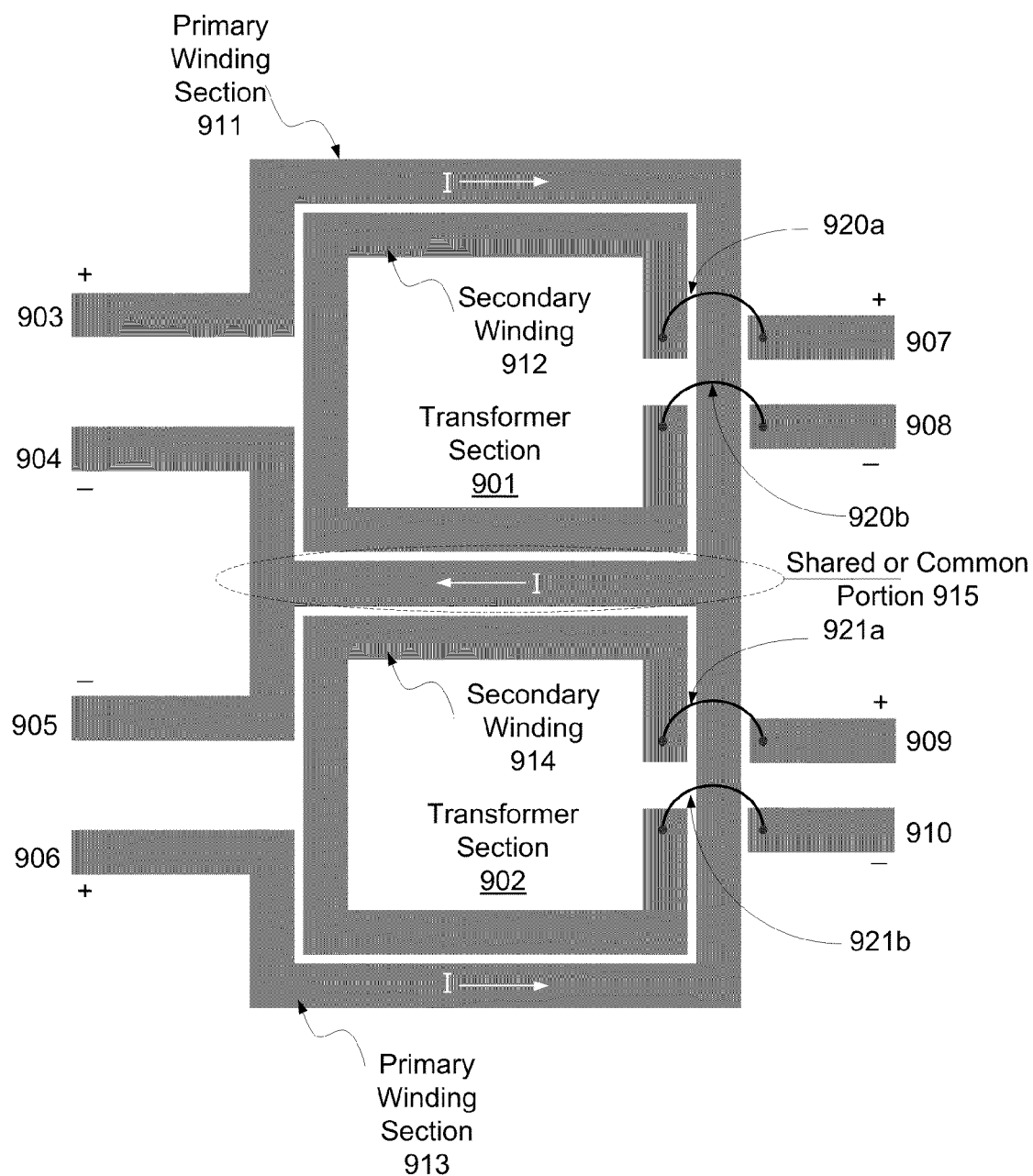
Figure 9B:
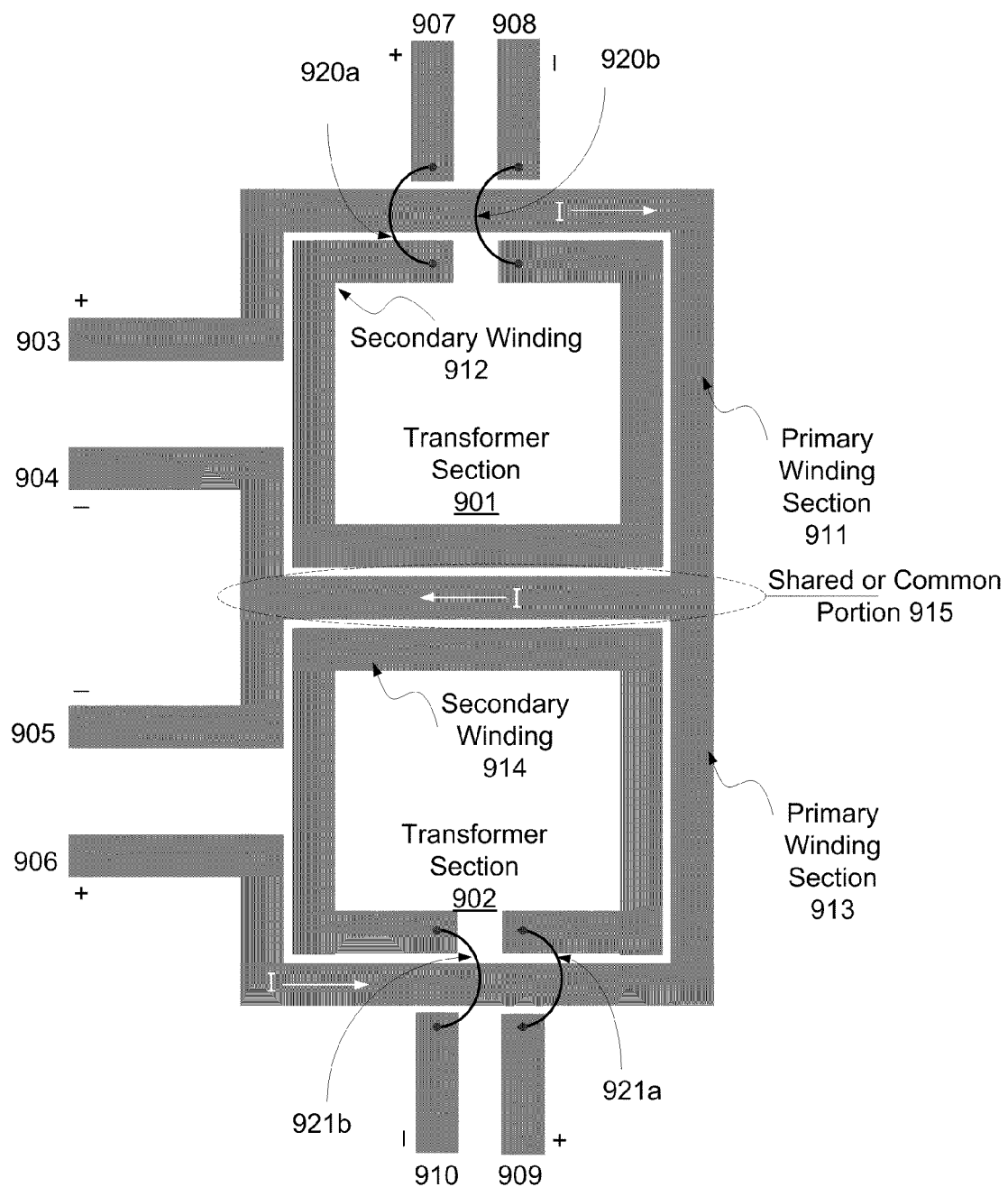
Figure 9C:
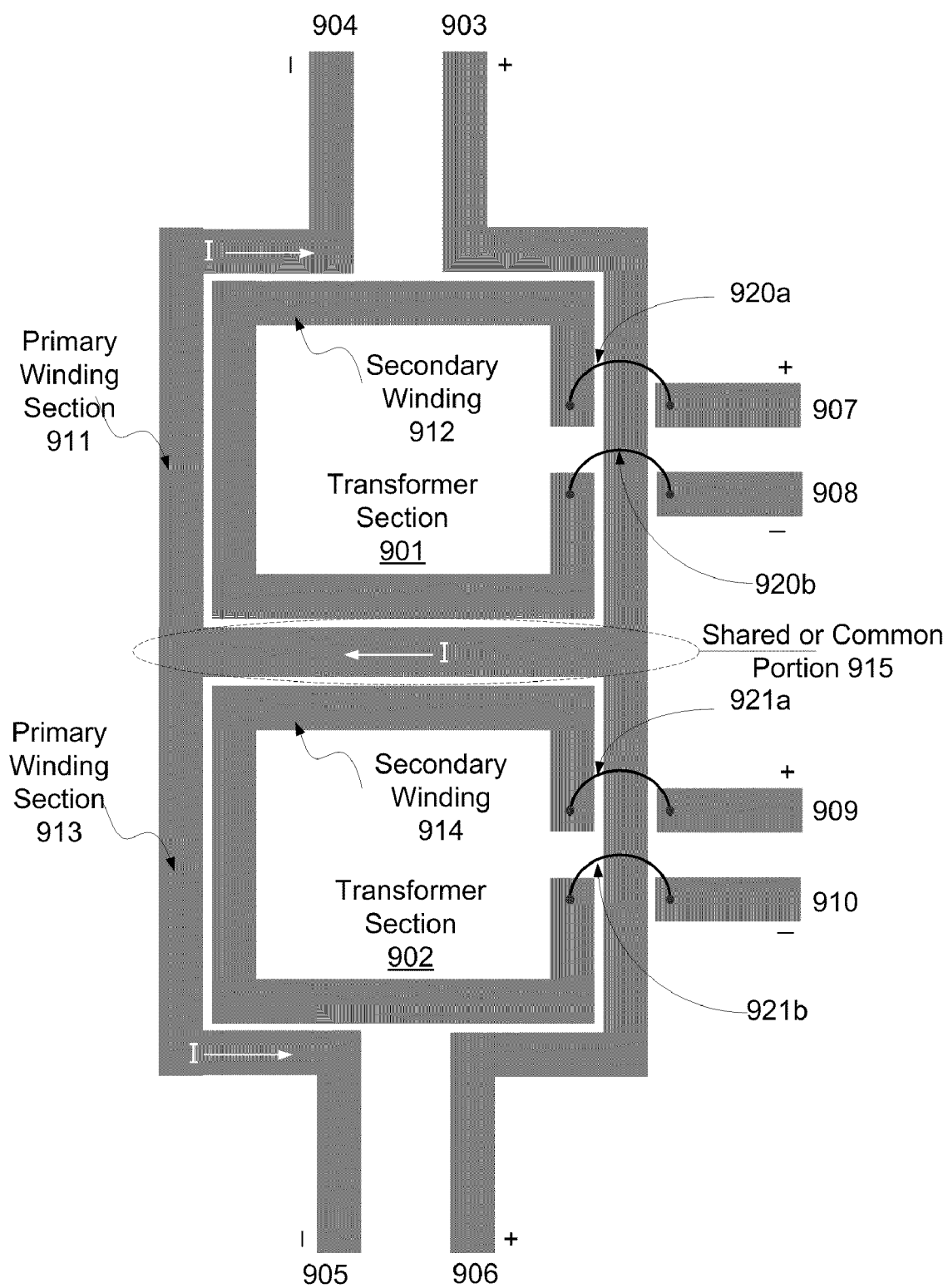

FIGS. 9A-9C illustrate several example embodiments of overlapping compact multiple transformers, according to an example embodiment of the invention.

Figure 10A:
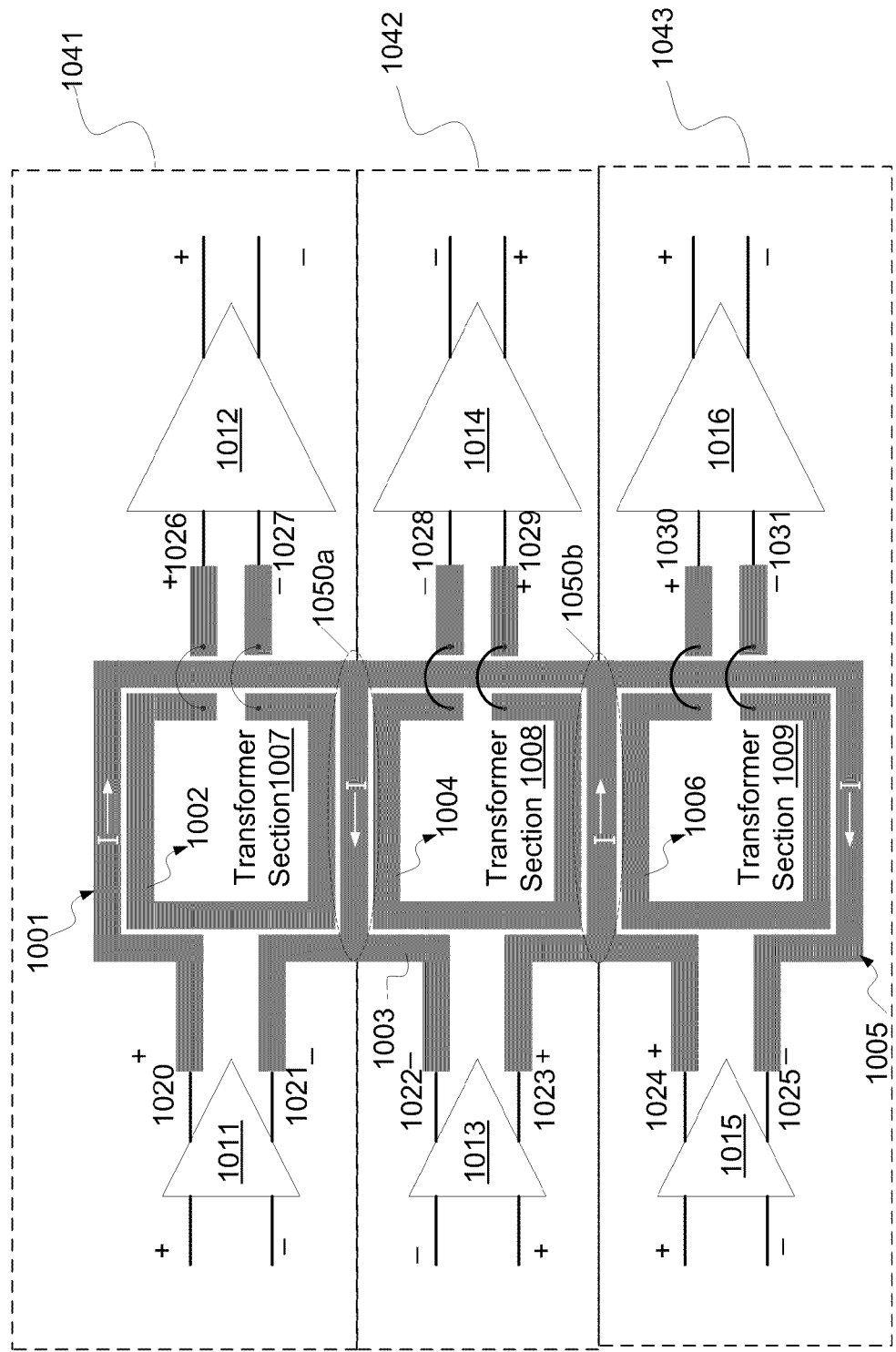
Figure 10B:
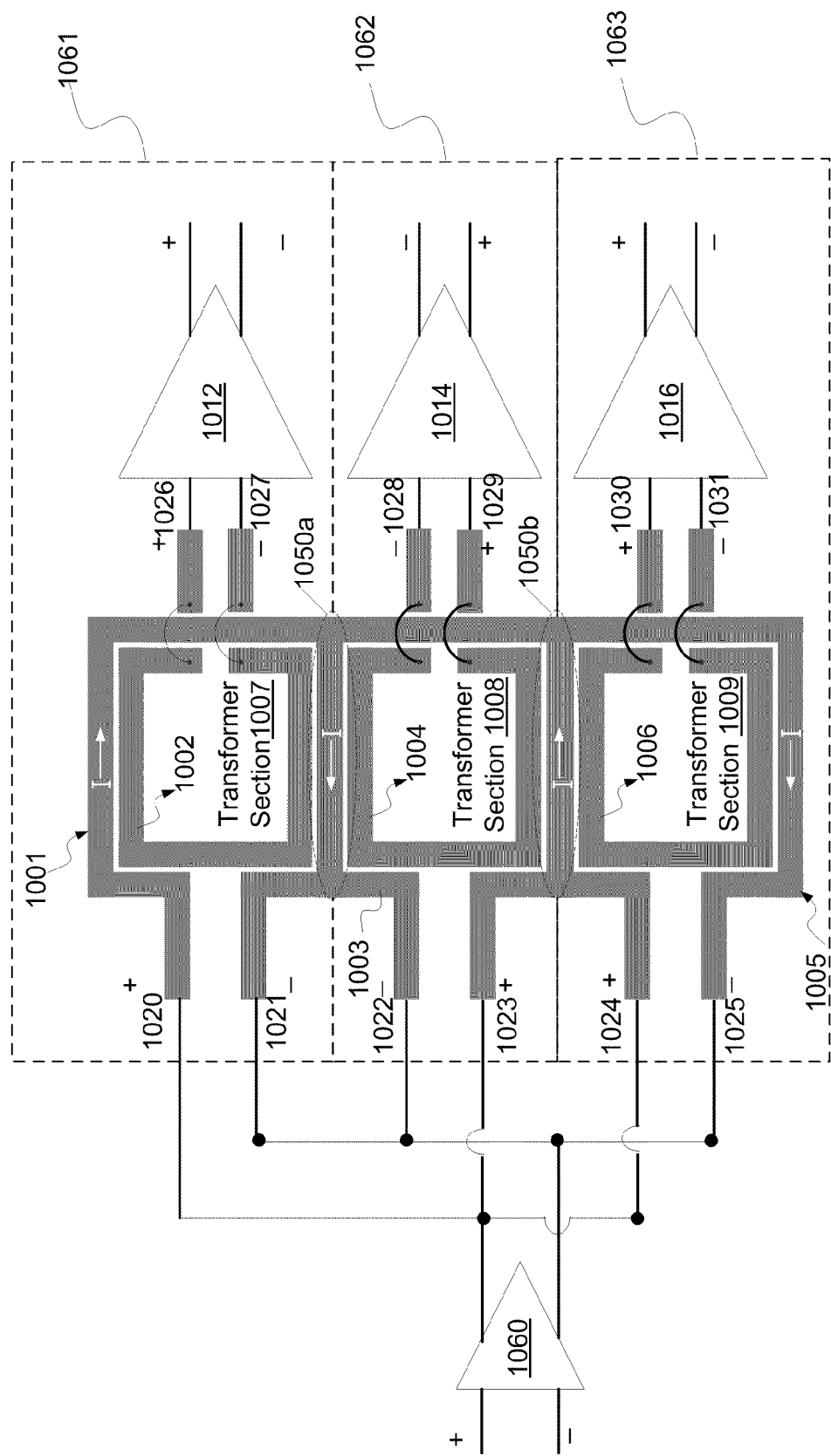

FIGS. 10A and 10B illustrate example applications for overlapping multiple transformers, according to an example embodiment of the invention.

Figure 11:
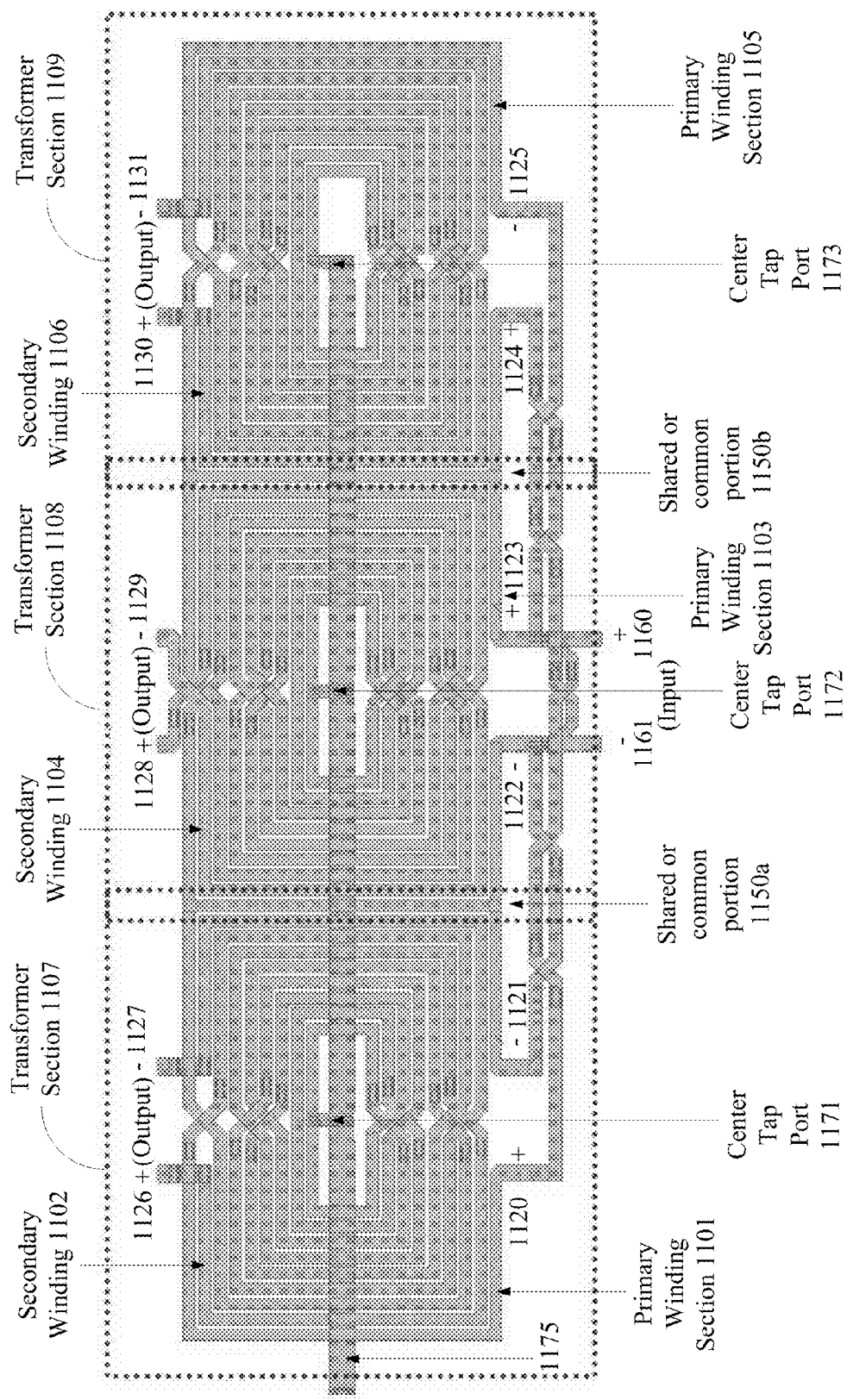

FIG. 11 illustrates an example system for overlapping multiple transformers, according to an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1A illustrates example compact multiple transformers, including a first transformer 101 and a second transformer 102, according to an example embodiment of the invention. As shown in FIG. 1A, the example compact multiple transformers may include a first transformer 101 that includes a primary winding 111 and a secondary winding 112. The primary winding 111 may receive input signals from a first input port 103 that may receive a positive input signal and a second input port 104 that may receive a negative input signal. According to an example embodiment of the invention, the primary winding 111 may be inductively coupled to the secondary winding 112. The secondary winding 112 may provide output signals to a first output port 107 providing a positive output signal and a second output port 108 providing a negative output signal. As shown in FIG. 1A, the outer primary winding 111 may encapsulate or surround one or more portions of the inner secondary winding 112. One or more wire-bond, via, or other electrical connections 120a, 120b may be used to route the output ports 107, 108 of the secondary winding 112 around the primary winding 111. For example, connection 120a may be used to electrically connect a first portion of the secondary winding 112 to the first output port 107, and connection 120b may be used to electrically connect a second portion of the secondary winding 112 to the second output port 108.

Similarly, the example compact multiple transformers of FIG. 1A may also include a second transformer 102 that may include a primary winding 113 and a secondary winding 114. The primary winding 113 may receive input signals from a first input port 105 that may receive a negative input signal and a second input port 106 that may receive a positive input signal. According to an example embodiment of the invention, the primary winding 113 may be inductively coupled to the secondary winding 114. The secondary winding 114 may provide output signals to a first output port 109 providing a positive signal output and a second output port 110 providing a negative signal output. As shown in FIG. 1A, the outer primary winding 113 may encapsulate or surround one or more portions of the inner secondary winding 114. One or more wire-bond, via, or other electrical connections 121a, 121b may be used to route the output ports 109, 110 of the secondary winding 114 around the primary winding 113. For example, connection 121a may be used to electrically connect a first portion of the secondary winding 114 to the first output port 109, and connection 121b may be used to electrically connect a second portion of the secondary winding 114 to the second output port 110.

According to an example embodiment of the invention, the first transformer 101 and the second transformer 102 may be spiral-type transformers, although other types of transformers may be utilized as well. It will also be appreciated that the primary windings 111, 113 and the secondary windings 112, 114 may be fabricated or otherwise patterned as conductive lines or traces using one or more metal layers provided on one or more semiconductor substrates. As an example, the metal layers may be comprised of copper, gold, silver, aluminum, nickel, a combination thereof, or yet other conductors, metals, and alloys, according to an example embodiment of the invention. According to an example embodiment of the invention, the transformers 101, 102 may be fabricated with other devices on the same substrate. For example, transistors, inductors, capacitors, resistors, and transmission lines may be fabricated with the transformers 101, 102 on the same substrate.

In FIG. 1A, the first transformer 101 and the second transformer 102 may be placed adjacent to each other according to a compact layout, according to an example embodiment of the invention. For example, a first section (e.g., a bottom section) of the primary winding 111 may be placed adjacent to a second section (e.g., a top section) of the primary winding 113 with a small separation distance. According to an example embodiment of the invention, the separation distance between the first section of the primary winding 111 and the adjacent second section of the primary winding 113 may be less than 50 μm, perhaps in the range of minimum spacing to 15 μm (e.g., perhaps 0.01-6 μm) for a highly compact layout or in the range of 15-30 μm (e.g., perhaps 12-14 μm) for a slightly less compact layout. Other spacing ranges may also be utilized without departing from example embodiments of the invention.

As shown in FIG. 1A, when the bottom section of the primary winding 111 is adjacent to the top section of the primary winding 113, the linear direction of the current flow through the adjacent primary winding sections may be provided in the same linear direction in order to magnetically couple the first transformer 101 to the second transformer 102 through the adjacent primary winding sections. In order for the adjacent primary winding sections to have the substantially the same linear current flow direction, the rotational current flow in the primary winding 111 may be provided in a first rotational direction while the rotational current flow in the primary winding 113 may be provided in a second rotational direction that is different from or opposite the first rotational direction. For example, by providing the primary winding 111 with a clockwise rotational current flow direction, the linear current flow in the bottom section of the primary winding 111 may be a right-to-left linear current flow direction. The adjacent top section of the primary winding 113 may likewise be provided with a right-to-left linear current flow direction by providing the primary winding 113 with a counterclockwise rotational current flow direction.

To provide the primary winding 111 with the clockwise rotational current flow direction, the first input port 103 may be provided with a positive input signal and the second input port 104 may be provided with a negative input signal, according to an example embodiment of the invention. On the other hand, to provide the primary winding 105 with the counterclockwise rotational current flow direction, the first input port 105 may be provided with a negative input signal and the second input port 106 may be provided with a positive input signal, according to an example embodiment of the invention.

In FIG. 1A, both the input ports 103, 104 for the first transformer 101 as well as the input ports 105, 106 for the second transformer 102 may be located on a left side of a compact layout according to an example embodiment of the invention. The output ports 107, 108 for the first transformer 101 as well as the output ports 109, 110 for the second transformer 102 may be located on a right side of the compact layout, according to an example embodiment of the invention. However, it will be appreciated that the locations of the input ports and output ports may also be a varied or otherwise reassigned according to an example embodiment of the invention. For example, the input ports of the transformers may be reassigned to provide the same current flow direction of the adjacent outer sections of the primary windings. Likewise, the output ports of transformers may be reassigned to provide the same current flow direction of the adjacent outer sections of the primary windings.

As an example, FIG. 1B illustrates a compact layout where the input ports 107, 108 for the first transformer 101 and the input ports 109, 110 for the second transformer 102 may be provided on a left side of the respective transformers 101, 102. However, the output ports 107, 108 for the first transformer 101 may be relocated to a top side of the first transformer 101 while the output ports 109, 110 for the second transformer 102 may be relocated to a bottom side of the second transformer 102. As another example, FIG. 1C illustrates a compact layout where the input ports 103, 104 for the first transformer 101 may be provided on a top side of the first transformer 101 while the input ports 105, 106 may be provided on a bottom side of the second transformer 102. The output ports 107, 108 for the first transformer 101 as well as the output ports 109, 110 may be placed on a right side of the respective transformers 101, 102. It will be the input ports and the output ports may be reassigned to various other locations without departing from example embodiments of the invention.

According to an example embodiment of the invention, the first and second transformers 101, 102 may have substantially symmetrical or mirrored structures. The symmetrical or mirrored structures may provide for good balancing of signals, according to an example embodiment of the invention. In an example embodiment of the invention, the line of symmetry may be defined according to a line between the adjacent sections of the first transformers 101, 102.

FIG. 2 illustrates an example application for compact multiple transformers, according to an example embodiment of the invention. In FIG. 2, there may be a plurality of amplifier blocks 241, 242, 243. According to an example embodiment of the invention, the amplifiers blocks 241, 242, 243 may be provided as parallel blocks.

The first amplifier block 241 may include a first-stage amplifier 211, a transformer 207, and a second-stage amplifier 212, according to an example embodiment of the invention. Likewise, the amplifier block 242 may include a first-stage amplifier 213, a transformer 208, and a second-stage amplifier 214, according to an example embodiment of the invention. The amplifier block 243 may include a first-stage amplifier 215, a transformer 209, and a second-stage amplifier 216. According to an example embodiment of the invention, the transformers 207, 208, 209 may be operative for inter-stage matching between a first and second electronic circuit blocks or first and second radio frequency (RF) circuit blocks. For example, the transformers 207, 208, 209 may be operative for inter-stage matching between the respective first-stage amplifier 211, 213, 215 and the respective second-stage amplifier 212, 214, 216, according to an example embodiment of the invention.

In FIG. 2, the first transformer 207 may be comprised of a primary winding 201 that encapsulates or surrounds one or more sections of the secondary winding 202. The second transformer 208 may be comprised of a primary winding 203 that encapsulates or surrounds one or more sections of the secondary winding 204. Likewise, the third transformer 209 may be comprised of a primary winding 205 that encapsulates or surrounds one or more sections of the secondary winding 206.

As shown in FIG. 2, the transformers 207, 208, 209 may be positioned according using compact layout in which the first transformer 207 and the third transformer 209 may sandwich the second transformer 208. According to an example embodiment of the invention, the separation distance between the adjacent sections of the primary windings 201, 203, 205 may be minimized to provide the compact layout. For example, the separation distance between adjacent sections of primary windings 201, 203, 205 may be less than 50 µm, perhaps in the range of minimum spacing to 15 µm (e.g., perhaps 0.01-6 µm) for a highly compact layout or in the range of 15-30 µm (e.g., perhaps 12-14 µm) for a slightly less compact layout. Other spacing ranges may also be utilized without departing from example embodiments of the invention.

In FIG. 2, the bottom section of the first primary winding 201 may have the same linear current flow direction (e.g., right-to-left current flow) as the top section of the second primary winding 203. Thus, the bottom section of the first primary winding 201 may be magnetically coupled to the top section of the second primary winding 203, according to an example embodiment of the invention. Similarly, the bottom section of the second primary winding 208 may have the same linear current flow direction (e.g., left-to-right current flow) as the top section of the third primary winding 205. Accordingly, the bottom section of the second primary winding 203 may be magnetically coupled to the top section of the third primary winding 205.

As discussed above, the primary winding 203 of the second transformer 208 may be magnetically coupled to both the first and third transformers 207, 209. However, to do so, the primary winding 203 of the second transformer may be provided with a first rotational current flow direction while the primary windings 201, 205 of the first and third transformers 207, 209 may be provided with a second rotational current flow direction different from or opposite the first rotational current flow direction. For example, the second primary winding 203 may be provided with a counterclockwise rotational current flow direction, thereby providing for a right-to-left linear current flow direction in its top section and a left-to-right linear current flow in its bottom section, according to an example embodiment of the invention. On the other hand, the first and third primary windings 201, 205 may be provided with a clockwise rotational current flow direction, thereby providing for a left-to-right linear current flow direction in their respective top sections and a right-to-left linear current flow direction in their respective bottom sections.

It will be appreciated that in order to provide the second primary winding 203 with first rotational current flow direction (e.g., counterclockwise), the first input port 222 may be connected to a negative input signal while the second input port 223 may be connected a positive input signal. On the other hand, the first input ports 220, 224 and the second input ports 221, 225 for the first and third primary windings 201, 205 may be connected with an opposite polarities than that for the second primary winding 203. For example, the first input ports 220, 224 may be connected to a positive input signal while the second input ports 221, 225 may be connected to a negative input signal. According to an example embodiment of the invention, the first-stage amplifiers 211, 213, 215 may be connected such as to provide the required negative or positive input signals to the respective first input ports 220, 222, 224 and second input ports 221, 223, 225.

Still referring to FIG. 2, the first output port 228 for the second transformer 208 may be provided with a negative output signal while the second output port 229 may be provided with a positive output signal, according to an example embodiment of the invention. On the other hand, the first output ports 226, 230 for the first and third transformers 207, 209 may be provided with a positive output signal while the second output ports 227, 231 may be provided with a negative output signal, according to an example embodiment of the invention. The second-stage amplifiers 212, 214, 216 may receive the negative or positive output signals from the respective first output ports 226, 228, 230 and second output ports 227, 229, 231. Thus, it will be appreciated that the input and output ports of the amplifiers may be reassigned according to current flow direction desired by the transformers, according to an example embodiment of the invention.

FIG. 3 illustrates example compact multiple transformers with multi-turn windings, according to an example embodiment of the invention. In particular, FIG. 3 illustrates a first transformer 305 and a second transformer 306. The first transformer 305 may include a primary multi-turn winding 301 (e.g., 2 or more turns) and a secondary multi-turn winding 302 (e.g., 2 or more turns), according to an example embodiment of the invention. The primary multi-turn winding 301 may include a plurality of inner and outer sections 301*a-c* that may be connected by one or more wire-bond, via, or other electrical connections, according to an example embodiment of the invention. The secondary multi-turn winding 302 may include a plurality of inner and outer sections 302*a-c* that may be connected by one or more wire-bond, via, or other electrical connections, according to an example embodiment of the invention. Similarly, the second transformer 306 may include a primary multi-turn winding 303 (e.g., 2 or more turns) and a secondary multi-turn winding 304 (e.g., 2 or more turns), according to an example embodiment of the invention. The primary multi-turn winding 303 may include a plurality of inner and outer sections 303*a-c* that may be connected by one or more wire-bond, via, or other electrical connections, according to an example embodiment of the invention. The secondary multi-turn winding 304 may include a plurality of inner and outer sections 304*a-c* that may be connected by one or more wire-bond, via, or other electrical connections, according to an example embodiment of the invention.

According to an example embodiment of the invention, the spacing between the adjacent sections 301*b*, 303*a* of the primary multi-turn windings 301, 303 may be minimized to provide a compact layout. For example, the spacing between the adjacent sections 301*b*, 303*a* may be less than 50 μm, perhaps in the range of minimum spacing to 15 μm (e.g., perhaps 0.01-6 μm) for a highly compact layout or in the range of 15-30 μm (e.g., perhaps 12-14 μm) for a slightly less compact layout. Other spacing ranges may also be utilized without departing from example embodiments of the invention.

In FIG. 3, the multi-turn primary winding 301 may be provided with a first rotational current direction (e.g., counterclockwise) when the multi-turn primary winding 303 may be provided with a second rotational current direction (e.g., clockwise) that is opposite the first rotational direction. Accordingly, when the bottom section 301*b* of the multi-turn primary winding 301 may have a linear current flow direction (e.g., left to right) that may be the same as that for the top section 303*a* of the multi-turn primary winding 303. According to an example embodiment of the invention, the bottom section 301*b* and the top section 303*a* may be magnetically coupled to each other.

In order to provide the first multi-turn primary winding 301 with the first rotational current direction, the primary multi-turn winding 301 may receive input signals from a first input port 310 that receives a negative input signal and a second input port 311 that receives a positive input signal. The secondary multi-turn winding 302 may provide output signals at a first output port 320 providing a negative output signal and a second output port 321 providing a positive output signal, according to an example embodiment of the invention.

On the other hand, in order to provide the second multi-turn primary winding 303 with the second rotational current direction opposite the first rotational current direction, the primary multi-turn winding 303 may receive input signals from a first input port 312 that receives a positive input signal and a second input port 313 that receives a negative input signal. The secondary multi-turn winding 304 may provide output signals at a first output port 322 providing a positive output signal and a second output port 323 providing a negative output signal. It will be appreciated that the input ports and the output ports may be reassigned to various other locations without departing from example embodiments of the invention.

FIG. 4 illustrates the compact layout of FIG. 1A where the multiple transformers are provided with DC feeds through center tap ports, according to an example embodiment of the invention. As shown in FIG. 4, each primary winding 111, 113 may include a respective center tap port 401, 402. Likewise, each secondary winding 112, 114 may include a respective center tap port 403, 404. The center tap ports 401, 402, 403, 404 may be at virtual AC grounds when differential signals are provided to respective input ports 103, 104 and 105, 106. According to an example embodiment of the invention, one or more respective DC bias voltages 411-414 may be fed through the one or more respective center tap ports 401-404. According to an example embodiment of the invention, the positions of the center tap ports 401-404 may correspond to a middle or symmetrical position of the respective primary windings 111, 113 or secondary winding 112, 114. However, in another example embodiment of the invention, the positions of the center tap ports 401-404 may vary from a middle or symmetrical position as well.

FIG. 5 illustrates the example compact multiple transformers of FIG. 1A, where the multiple transformers may be provided with tuning blocks through center tap ports, according to an example embodiment of the invention. As shown in FIG. 5, each primary winding 111, 113 may include a respective center tap port 501, 502. Likewise, each secondary winding 112, 114 may include a respective center tap port 503, 504. The center tap ports 501, 502, 503, 504 may be at virtual AC grounds when differential signals are provided to respective input ports 103, 104 and 105, 106. According to an example embodiment of the invention, one or more tuning blocks 511, 512, 513, 514 may be provided to the respective windings 501-504 through respective center tap ports 501-504. According to an example embodiment of the invention, one or more tuning blocks 511-514 may be utilized to tune the frequency characteristics of the transformers 101, 102. For example, the tuning blocks 511-514 may be operative to control, adjust, filter, or otherwise tune the frequency bands of coupling, according to an example embodiment of the invention. As another example, the tuning blocks 511-514 may be resonant circuits that are operative to selectively enhance or suppress one or more frequency components, according to an example embodiment of the invention. According to an example embodiment of the invention, the tuning blocks 511-514 may have arbitrary complex impedances from 0 to infinity for one or more frequency bands.

FIG. 6A is a schematic diagram of an example tuning block, according to an example embodiment of the invention. As shown in FIG. 6A, the tuning block may be a resonant circuit comprised of a capacitive component 601 and an inductive component 602 connected in series, according to an example embodiment of the invention. The port 600 of the resonant circuit may be connected to a center tap port of a primary and/or a secondary winding, according to an example embodiment of the invention. The resonant circuit of FIG. 6A may have an associated resonant frequency fn 603, according to an example embodiment of the invention.

FIG. 6B illustrates another schematic diagram of an example tuning block, according to an example embodiment of the invention. As shown in FIG. 6B, the tuning block may be a resonant circuit comprised of a capacitive component 611 in parallel with an inductive component 612. The port 610 of the resonant circuit may be connected to a center tap port of a primary and/or a secondary winding, according to an example embodiment of the invention. The resonant circuit may have a resonant frequency fn 613, according to an example embodiment of the invention.

FIG. 6C illustrates another schematic diagram of an example tuning block, according to an example embodiment of the invention. As shown in FIG. 6C, there may be a resonant circuit having a plurality of resonant frequencies such as resonant frequencies fn1 627, fn2 628, and fn3 629. For example, capacitive component 621 and inductive component 622 may be connected in series to provide resonant frequency fn1 627. Likewise, capacitive component 623 may be connected in series to inductive component 624 to provide resonant frequency fn2 628. Additionally, capacitive component 625 may be connected in series with inductive component 626 to provide resonant frequency fn3 629. The port 620 of the resonant circuit may be connected to a center tap port of a primary and/or a secondary winding, according to an example embodiment of the invention. It will be appreciated that while FIG. 6C illustrates a particular configuration for a resonant circuit, other embodiments of the invention may include varying types of series/parallel resonant circuits without departing from example embodiments of the invention. Furthermore, while the tuning blocks are illustrated as being connected at the center tap ports, other embodiments of the invention may connect the tuning blocks to the primary windings in other locations as well.

It will be appreciated that the values and parameters of the capacitive and inductive components of FIGS. 6A-6C may be selected to have one or more desired resonant frequencies. Furthermore, the resonant circuits may also include resistive components as well. According to an example embodiment of the invention, the one or more resonant frequencies of the tuning block may be operative to filter undesirable harmonics or enhance other harmonics at the one or more resonant frequencies, thereby controlling the frequencies of coupling. The one or more tuning blocks can also be used to modify or provide a delay or frequency adjustment needed to synchronize the input or output signals, according to an example embodiment of the invention.

According to an example embodiment of the invention, the layouts for the transformers described herein may be implemented utilizing a planar structure or a stacked structure. With a planar structure, the plurality of transformers may be placed substantially in the same metal layer. For example, as shown in the example planar substrate structure of FIG. 7, the plurality of transformers may all be fabricated on the same first metal layer 702. Routing between input and output ports or between sections of the primary/secondary winding may be accomplished using one or more via, wire-bond, or other electrical connections, according to an example embodiment of the invention.

According to another example embodiment of the invention, the layouts for the transformers may also be implemented utilizing a stacked structure. For example, in the stacked substrate structure of FIG. 8, a first transformer may be formed on metal layer 802 while a second transformer may be formed on metal layer 804, according to an example embodiment of the invention. Routing between input and output ports or between sections of the primary/secondary winding may be accomplished using one or more via, wire-bond, or other electrical connections, according to an example embodiment of the invention. It will be appreciated that the example layouts may also be applied to the overlapping multiple transformers described herein.

FIGS. 9A-9C illustrate several example embodiments of overlapping compact multiple transformers, according to an example embodiment of the invention. These overlapping compact multiple transformers include a plurality of transformer sections, each with at least one respective primary winding section and at least one respective secondary winding. However, a primary winding section of one transformer section may have a portion that is electrically shared or overlapping with a primary winding section of an adjacent transformer section. With shared or overlapping portions (which may also be referred to as common portions), there may be a common current flow that is shared between the primary winding sections of the adjacent transformer sections. Due to the shared or overlapping portions, an improved impedance transition efficiency may be provided by the overlapping compact multiple transformers. It will be appreciated that while FIGS. 9A-9C illustrate only two transformer sections, the shared or overlapping portions can equally be applied to more than two transformer sections, as illustrated with respect to FIGS. 10A, 10B, and 11.

Turning now to FIG. 9A, the overlapping multiple transformers can be implemented using a first transformer section 901 and a second transformer section 902, according to an example embodiment of the invention. As shown in FIG. 9A, the example overlapping multiple transformers may include a first transformer section 901 that includes a primary winding section 911 and a secondary winding 912. The primary winding section 911 may receive input signals from a first input port 903 that may receive a positive input signal and a second input port 904 that may receive a negative input signal. According to an example embodiment of the invention, the primary winding section 911 may be inductively coupled to the secondary winding 912. The secondary winding 912 may provide output signals to a first output port 907 providing a positive output signal and a second output port 908 providing a negative output signal. As shown in FIG. 9A, the outer primary winding section 911 may encapsulate or surround one or more portions of the inner secondary winding 912, which may include encapsulating a portion or substantially all of the inner secondary winding 912. One or more wire-bond, via, or other electrical connections 920a, 920b may be used to route or provide the output ports 907, 908 of the secondary winding 912 around the primary winding section 911. For example, connection 920a may be used to electrically connect a first portion of the secondary winding 912 to the first output port 907, and connection 920b may be used to electrically connect a second portion of the secondary winding 912 to the second output port 908.

Similarly, the example compact multiple transformers of FIG. 9A may also include a second transformer section 902 that may include a primary winding section 913 and a secondary winding 914. The primary winding section 913 may receive input signals from a first input port 905 that may receive a negative input signal and a second input port 906 that may receive a positive input signal. According to an example embodiment of the invention, the primary winding section 913 may be inductively coupled to the secondary winding 914. The secondary winding 914 may provide output signals to a first output port 909 providing a positive signal output and a second output port 910 providing a negative signal output. As shown in FIG. 9A, the outer primary winding section 913 may encapsulate or surround one or more portions of the inner secondary winding 914, which may include encapsulating a portion or substantially all of the inner secondary winding 912. One or more wire-bond, via, or other electrical connections 921a, 921b may be used to route the output ports 909, 910 of the secondary winding 914 around the primary winding section 913. For example, connection 921a may be used to electrically connect a first portion of the secondary winding 914 to the first output port 909, and connection 921b may be used to electrically connect a second portion of the secondary winding 914 to the second output port 910.

According to an example embodiment of the invention, the first transformer section 901 and the second transformer section 902 may be spiral-type transformers, although other types of transformers may be utilized as well. It will also be appreciated that the primary winding sections 911, 913 and the secondary windings 912, 914 may be fabricated or otherwise patterned as conductive lines or traces using one or more metal layers provided on one or more semiconductor substrates. As an example, the metal layers may be comprised of copper, gold, silver, aluminum, nickel, a combination thereof, or yet other conductors, metals, and alloys, according to an example embodiment of the invention. According to an example embodiment of the invention, the transformer sections 901, 902 may be fabricated with other devices on the same substrate. For example, transistors, inductors, capacitors, resistors, and transmission lines may be fabricated with the transformer sections 901, 902 on the same substrate.

In FIG. 9A, the first transformer section 901 and the second transformer section 902 may be placed adjacent to each other according to an overlapping compact layout, according to an example embodiment of the invention. For example, a first section (e.g., a bottom section) of the primary winding section 911 may be placed adjacent to, or may be common with, a second section (e.g., a top section) of the primary winding section 913 with zero separation distance (or otherwise forming a same section), to provide a shared or common portion 915. In other words, the primary winding sections 911 and 913 may include a shared or common portion 915, which may provide for a common current flow through the shared or common portion 915. Because there is a common current flow through the shared or common portion 915, it may be preferable in an example embodiment for the primary winding sections 911, 913 to be positioned relative to each other such that current or flux of each of the primary winding sections 911, 913 are summed in phase through the shared or common portion 915. It will be appreciated that the shared or common portion 915 can be characterized or implemented as two adjacent portions of the primary winding sections 911 and 913 that have zero separation distance (or otherwise forming a same section), or that are otherwise electrically connected to each other in a lateral matter or a vertical/overlapping manner. For example, the two adjacent portions of the primary winding sections 911, 913 can be electrically fused together (e.g., conductive adhesive, solder, etc.) or configured to electrically overlap to provide the shared or common portion 915.

As shown in FIG. 9A, there may be a common current flow through the shared or common portion 915. In order to all the current or flux of each of the primary winding sections 911, 913 to be summed in phase through the shared or common portion 915, the rotational current flow in the primary winding section 911 may be provided in a first rotational direction while the rotational current flow in the primary winding section 913 may be provided in a second rotational direction that is different from or opposite the first rotational direction. For example, by providing the primary winding section 911 with a clockwise rotational current flow direction, the linear current flow in the shared or common portion 915 of the primary winding section 911 may be a right-to-left linear current flow direction. The shared or common portion 915 of the primary winding section 913 may likewise be provided with a right-to-left linear current flow direction by providing the primary winding section 913 with a counterclockwise rotational current flow direction. Because the primary winding sections 911 and 913 are electrically connected by way of a shared or common portion 915, the primary winding sections 911 and 913 can also be characterized as forming a single, meandering primary winding that is inductively coupled to respective secondary windings 912, 914 (at respective sections 911 and 913), according to an example embodiment of the invention.

It will be appreciated that to provide the appropriate current flow directions described herein, the appropriate polarity (+ or −) signals will need to be provided to ports 903, 904 of the primary winding section 911, as well as to ports 905, 906 of the primary winding section 913. For example, to provide the primary winding section 911 with the clockwise rotational current flow direction, the first input port 903 may be provided with a positive input signal and the second input port 904 may be provided with a negative input signal, according to an example embodiment of the invention. On the other hand, to provide the primary winding 905 with the counterclockwise rotational current flow direction, the first input port 905 may be provided with a negative input signal and the second input port 906 may be provided with a positive input signal, according to an example embodiment of the invention.

In FIG. 9A, both the input ports 903, 904 for the first transformer section 901 as well as the input ports 905, 906 for the second transformer section 902 may be located on a left side of a compact layout according to an example embodiment of the invention. Furthermore, it will be appreciated that the ports 903-906 may be provided in a sequential positive/negative/negative/positive configuration, respectively instead of the typical alternating positive and negative configuration. The two adjacent negative input ports 904, 905, as sandwiched by the exterior positive input ports 903, 906, may be preferable in some example embodiments to facilitate the routing to appropriate connections to one or more amplifiers or other devices, or to otherwise maintain an appropriate synchronization and/or delay of positive and negative signals. The output ports 907, 908 for the first transformer section 901 as well as the output ports 909, 910 for the second transformer section 902 may be located on a right side of the compact layout, according to an example embodiment of the invention. Again, it will be appreciated that the ports 907-910 may be provided in a sequential positive/negative/negative/positive configuration, respectively instead of the typical alternating positive and negative configuration, according to an example embodiment of the invention. The two adjacent negative output ports 908, 909, as sandwiched by the exterior positive output ports 907, 910, may be preferable in some example embodiments to facilitate the routing to appropriate connections to one or more amplifiers or other devices, or to otherwise maintain an appropriate synchronization and/or delay of positive and negative signals, according to an example embodiment of the invention.

It will be appreciated that the locations of the input ports and output ports shown in FIG. 9A may also be a varied or otherwise reassigned according to an example embodiment of the invention. For example, the input ports of the transformers may be reassigned to provide the same current flow direction of the adjacent outer sections of the primary windings. Likewise, the output ports of transformers may be reassigned to provide the same current flow direction of the adjacent outer sections of the primary windings.

As an example, FIG. 9B illustrates a compact layout where the input ports 907, 908 for the first transformer section 901 and the input ports 909, 910 for the second transformer section 902 may be provided on a left side of the respective transformer sections 901, 902. However, the output ports 907, 908 for the first transformer section 901 may be relocated to a top side of the first transformer section 901 while the output ports 909, 910 for the second transformer section 902 may be relocated to a bottom side of the second transformer section 902. As another example, FIG. 9C illustrates a compact layout where the input ports 903, 904 for the first transformer section 901 may be provided on a top side of the first transformer section 901 while the input ports 905, 906 may be provided on a bottom side of the second transformer section 902. The output ports 907, 908 for the first transformer section 901 as well as the output ports 909, 910 may be placed on a right side of the respective transformer sections 901, 902. It will be the input ports and the output ports may be reassigned to various other locations without departing from example embodiments of the invention.

According to an example embodiment of the invention, the first and second transformer sections 901, 902 may have substantially symmetrical or mirrored structures. The symmetrical or mirrored structures may provide for good balancing of signals, according to an example embodiment of the invention. In an example embodiment of the invention, the line of symmetry may be defined according to a line following the common or shared portion 915 of the first transformer sections 901, 902.

FIG. 10A illustrates an example application for overlapping multiple transformers, according to an example embodiment of the invention. In FIG. 10A, there may be a plurality of amplifying sections 1041, 1042, 1043. According to an example embodiment of the invention, the amplifying sections 1041, 1042, 1043 may be provided as parallel sections.

The first amplifying section 1041 may include a first-stage amplifier 1011, a transformer section 1007, and a second-stage amplifier 1012, according to an example embodiment of the invention. Likewise, the second amplifying section 1042 may include a first-stage amplifier 1013, a transformer section 1008, and a second-stage amplifier 1014, according to an example embodiment of the invention. The third amplifying section 1043 may include a first-stage amplifier 1015, a transformer section 1009, and a second-stage amplifier 1016. According to an example embodiment of the invention, the transformer sections 1007, 1008, 1009 may be operative for inter-stage matching between first and second electronic circuit blocks or between first and second RF circuit blocks. For example, the transformer sections 1007, 1008, 1009 may be operative for inter-stage matching between the respective first-stage amplifier 1011, 1013, 1015 and the respective second-stage amplifier 1012, 1014, 1016, according to an example embodiment of the invention.

In FIG. 10A, the first transformer section 1007 may be comprised of a primary winding section 1001 that encapsulates or surrounds one or more sections of the secondary winding 1002, which may include encapsulating a portion or substantially all of the secondary winding 1002. The second transformer section 1008 may be comprised of a primary winding section 1003 that encapsulates or surrounds one or more sections of the secondary winding 1004, which may include encapsulating a portion or substantially all of the secondary winding 1004. Likewise, the third transformer section 1009 may be comprised of a primary winding section 1005 that encapsulates or surrounds one or more sections of the secondary winding 1006, which may include encapsulating a portion or all substantially all of the secondary winding 1006.

As shown in FIG. 10A, the transformer sections 1007, 1008, 1009 may be positioned adjacent to each other according to an overlapping compact layout, according to an example embodiment of the invention. Indeed, the first and third transformer sections 1007, 1009 may sandwich the second transformer section 1008. For example, a first section (e.g., a bottom section) of the first primary winding section 1001 may be placed adjacent to, or may be common with, a second section (e.g., a top section) of the second primary winding section 1003 with zero separation distance (or otherwise forming a same section), to provide a shared or common portion 1050a. In other words, the primary winding sections 1001 and 1003 may include a shared or common portion 1050a, which may provide for a common current flow through the shared or common portion 1050a. Furthermore, a third section (e.g., a bottom section) of the second primary winding section 1003 may be placed adjacent to, or may be common with, a fourth section (e.g., a top section) of the third primary winding section 1005 with zero separation distance (or otherwise forming a same section), to provide a shared or common portion 1050b. In other words, the primary winding sections 1001 and 1003 may include a shared or common portion 1050b, which may provide for a common current flow through the shared or common portion 1050b.

Because there is a common current flow through the shared or common portion 1050a, it may be preferable in an example embodiment for the primary winding sections 1001, 1003 to be positioned relative to each other such that current or flux of each of the primary winding sections 1001, 1003 are summed in phase through the shared or common portion 1050a. Likewise, because there is a common current flow through the shared or common portion 1050b, it may be preferable in an example embodiment for the primary winding sections 1003, 1005 to be positioned relative to each other such that current or flux of each of the primary winding sections 1003, 1005 are summed in phase through the shared or common portion 1050b. It will be appreciated that the shared or common portion 1050a can each be characterized or implemented as two adjacent portions of the primary winding sections 1001 and 1003 that have zero separation distance (or otherwise forming a same section), or that are otherwise electrically connected to each other in a lateral matter or a vertical/overlapping manner. Similarly, the shared or common portion 1050b can each be characterized or implemented as two adjacent portions of the primary winding sections 1003 and 1005 that have zero separation distance (or otherwise forming a same section), or that are otherwise electrically connected to each other in a lateral matter or a vertical/overlapping manner. For example, the two adjacent portions of the primary winding sections 1001, 1003 can be electrically fused together (e.g., conductive adhesive, solder, etc.) or configured to electrically overlap to provide the shared or common portion 1050a. Similarly, the two adjacent portions of the primary winding sections 1003, 1005 can be electrically fused together (e.g., conductive adhesive, solder, etc.) or configured to electrically overlap to provide the shared or common portion 1050b.

In FIG. 10A, the bottom section of the first primary winding section 1001 may have the same linear current flow direction (e.g., right-to-left current flow) as the top section of the second primary winding section 1003, as a common current flows through the shared or common portion 1050a. Thus, the bottom section of the first primary winding section 1001 may be electrically coupled to, or may be common with, the top section of the second primary winding section 1003, according to an example embodiment of the invention. Similarly, the bottom section of the second primary winding section 1003 may have the same linear current flow direction (e.g., left-to-right current flow) as the top section of the third primary winding section 1005, as a common current flows through the shared or common portion 1050b. Accordingly, the bottom section of the second primary winding section 1003 may be electrically coupled to, or may be common with, the top section of the third primary winding section 1005.

As discussed herein, the primary winding section 1003 of the second transformer section 1008 may be coupled to both the first and third transformer sections 1007, 1009 via the respective shared or common portions 1050a, 1050b. To ensure that flux or current is summed in the shared or common portions 1050a, 1050b, the primary winding section 1003 of the second transformer may be provided with a first rotational current flow direction while the primary winding sections 1001, 1005 of the first and third transformers 1007, 1009 may be provided with a second rotational current flow direction different from or opposite the first rotational current flow direction. For example, the second primary winding section 1003 may be provided with a counterclockwise rotational current flow direction, thereby providing for a right-to-left linear current flow direction in its top section (corresponding to the shared or common portion 1050a) and a left-to-right linear current flow in its bottom section (corresponding to the shared or common portion 1050b), according to an example embodiment of the invention. On the other hand, the first and third primary winding sections 1001, 1005 may be provided with a clockwise rotational current flow direction, thereby providing for a left-to-right linear current flow direction in their respective top sections (corresponding to shared or common section 1050b for the third primary winding section 1005) and a right-to-left linear current flow direction in their respective bottom sections (corresponding to shared or common section 1050a for the first primary winding section 1001).

It will be appreciated that in order to provide the second primary winding section 1003 with first rotational current flow direction (e.g., counterclockwise), the first input port 1022 may be connected to a negative input signal while the second input port 1023 may be connected a positive input signal. On the other hand, the first input ports 1020, 1024 and the second input ports 1021, 1025 for the first and third primary winding sections 1001, 1005 may be connected with an opposite polarities than that for the second primary winding section 1003. For example, the first input ports 1020, 1024 may be connected to a positive input signal while the second input ports 1021, 1025 may be connected to a negative input signal. According to an example embodiment of the invention, the first-stage amplifiers 1011, 1013, 1015 may be connected such as to provide the required negative or positive input signals to the respective first input ports 1020, 1022, 1024 and second input ports 1021, 1023, 1025.

Still referring to FIG. 10A, the first output port 1028 for the second transformer section 1008 may provide a negative output signal while the second output port 1029 may provide a positive output signal, according to an example embodiment of the invention. On the other hand, the first output ports 1026, 1030 for the first and third transformers 1007, 1009 may provide a positive output signal while the second output ports 1027, 1031 may provide a negative output signal, according to an example embodiment of the invention. The second-stage amplifiers 1012, 1014, 1016 may receive the negative or positive output signals from the respective first output ports 1026, 1028, 1030 and second output ports 1027, 1029, 1031.

The two adjacent negative input ports 1021, 1022 (sandwiched by positive ports 1020, 1023), as well as the two adjacent positive input ports 1023, 1024 (sandwiched by negative ports 1022, 1025) may be preferable in some example embodiments to facilitate the routing to appropriate connections to one or more amplifiers 1011, 1013, 1015 or other devices, or to otherwise maintain an appropriate synchronization and/or delay of positive and negative signals. Likewise, the two adjacent negative output ports 1027, 1028 (sandwiched by positive ports 1026, 1029), as well as the two adjacent positive output ports 1029, 1030 (sandwiched by negative ports 1028, 1031) may be preferable in some example embodiments to facilitate the routing to appropriate connections to one or more amplifiers 1012, 1014, 1016 or other devices, or to otherwise maintain an appropriate synchronization and/or delay of positive and negative signals. It will also be appreciated that the input and output ports of the amplifiers may be reassigned according to current flow direction desired by the transformers, according to an example embodiment of the invention.

FIG. 10B illustrates an alternative application for the compact multiple transformers described with respect to FIG. 10A. In particular, FIG. 10A still illustrates three transformer sections 1061, 1062, 1063. However, in FIG. 10B, each of the three transformer sections 1061, 1062, 1063 share one or more common amplifiers 1060. More specifically, the positive input ports 1020, 1023, and 1024 may receive a positive signal from the output of one or more common amplifiers 1060. Similarly, the negative input ports 1021, 1022, and 1025 may receive a negative signal from the output of one or more common amplifiers 1060. It will be appreciated that the routing connections from the ports 1020-1025 to the power amplifier 1060 may be implemented using a variety of ways, according to an example embodiment of the invention. Likewise, while not illustrated in FIG. 10B, the amplifiers 1012, 1014, 1016 could also be replaced with one or more common amplifiers and similar routing connections, according to an example embodiment of the invention.

While not described in detail with respect to FIGS. 9A, 9B, 9C, and 10, it will be appreciated that one or more of the primary winding segments or secondary winding may include a respective center tap port, as similarly described herein. The center tap ports can be used to provide a DC bias feed to one or more amplifiers or other devices. Likewise, the center tap ports can be used to connect to one or more tuning blocks such as those described with respect to FIGS. 6A-6C. The one or more tuning blocks can be used to filter undesirable harmonics or enhance other harmonics at the one or more resonant frequencies, thereby controlling the frequencies of coupling. The one or more tuning blocks can also be used to modify or provide a delay or frequency adjustment needed to synchronize the input or output signals, according to an example embodiment of the invention.

FIG. 11 illustrates an example system for overlapping multiple transformers, according to an example embodiment of the invention. The example system may include a first transformer section 1107, a second transformer section 1108, and a third transformer section 1109.

In FIG. 11, the first transformer section 1107 may be comprised of a primary winding section 1101 that encapsulates or surrounds one or more sections of the secondary winding 1102, which may include encapsulating a portion or substantially all of the secondary winding 1102. The second transformer section 1108 may be comprised of a primary winding section 1103 that encapsulates or surrounds one or more sections of the secondary winding 1104, which may include encapsulating a portion or substantially all of the secondary winding 1104. Likewise, the third transformer section 1109 may be comprised of a primary winding section 1105 that encapsulates or surrounds one or more sections of the secondary winding 1106, which may include encapsulating a portion or substantially all of the secondary winding 1106.

The transformer sections 1107, 1108, 1109 may be positioned adjacent to each other according to an overlapping compact layout, according to an example embodiment of the invention. Indeed, the first and third transformer sections 1107, 1109 may sandwich the second transformer section 1108. For example, a first section (e.g., a right section) of the first primary winding section 1101 and a second section (e.g., a left section) of the second primary winding section 1103 may be the same shared or common portion 1150a. In other words, the primary winding sections 1101 and 1103 may include a shared or common portion 1150a, which may provide for a common current flow through the shared or common portion 1150a. Furthermore, a third section (e.g., a right section) of the second primary winding section 1103 and a fourth section (e.g., a left section) of the third primary winding section 1105 may be a same shared or common portion 1150b. In other words, the primary winding sections 1101 and 1103 may include a shared or common portion 1150b, which may provide for a common current flow through the shared or common portion 1150b.

Because there is a common current flow through the shared or common portion 1150a, it may be preferable in an example embodiment for the primary winding sections 1101, 1103 to be positioned relative to each other such that current or flux of each of the primary winding sections 1101, 1103 are summed in phase through the shared or common portion 1150a. Likewise, because there is a common current flow through the shared or common portion 1150b, it may be preferable in an example embodiment for the primary winding sections 1103, 1105 to be positioned relative to each other such that current or flux of each of the primary winding sections 1103, 1105 are summed in phase through the shared or common portion 1150b. It will be appreciated that the shared or common portion 1150a can each be characterized or implemented as two adjacent portions of the primary winding sections 1101 and 1103 that have zero separation distance (or otherwise forming a same section), or that are otherwise electrically connected to each other in a lateral matter or a vertical/overlapping manner. Similarly, the shared or common portion 1150b can each be characterized or implemented as two adjacent portions of the primary winding sections 1103 and 1105 that have zero separation distance (or otherwise forming a same section), or that are otherwise electrically connected to each other in a lateral matter or a vertical/overlapping manner. For example, the two adjacent portions of the primary winding sections 1101, 1103 can be electrically fused together (e.g., conductive adhesive, solder, etc.) or configured to electrically overlap to provide the shared or common portion 1150a. Similarly, the two adjacent portions of the primary winding sections 1103, 1105 can be electrically fused together (e.g., conductive adhesive, solder, etc.) or configured to electrically overlap to provide the shared or common portion 1050b.

Still referring to FIG. 11, the first input port 1122 may be connected to a negative input signal while the second input port 1123 may be connected a positive input signal. On the other hand, the first input ports 1120, 1124 and the second input ports 1121, 1125 for the first and third primary winding sections 1101, 1105 may be connected with opposite polarities than that for the second primary winding section 1103. For example, the first input ports 1120, 1124 may be connected to a positive input signal while the second input ports 1121, 1125 may be connected to a negative input signal. It will be appreciated that the input ports 1120-1125 may be configured to receive the appropriate positive and negative signals in order to facilitate the appropriate flow of current in a constructive manner through shared or common portions 1150a, 1150b, according to an example embodiment of the invention. It will also be appreciated that the positive ports 1120, 1123, and 1124 may be commonly connected to a positive system port 1160, while the negative ports 1121, 1122, and 1125 may be commonly connected to a negative system port 1161 without departing from example embodiments of the invention. As such one or more common amplifiers or other devices can provide the respective positive and negative signal to the respective positive system port 1160 and negative system port 1161. However, it will also be appreciated that respective amplifiers or other devices can also be provided to the input ports for each respective transformer section 1107, 1108, and 1109 without departing from example embodiments of the invention.

Still referring to FIG. 11, the first output port 1128 for the second transformer section 1108 may provide a negative output signal while the second output port 1129 may provide a positive output signal, according to an example embodiment of the invention. On the other hand, the first output ports 1126, 1130 for the first and third transformer sections 1107, 1109 may provide a positive output signal while the second output ports 1127, 1131 may provide a negative output signal, according to an example embodiment of the invention. Respective amplifiers or other devices may be connected to the respective output ports of each transformer section 1107, 1108, 1109; however, there may be one or more common amplifiers or other devices connected to a system positive output port and a system negative output port that are connected to the respective positive and negative ports of the transformer sections 1107, 1108, 1109.

FIG. 11 also shows respective center tap ports 1171, 1172, and 1173 being connected to the respective primary winding sections 1101, 1103, 1105. As described herein, the center tap ports 1171, 1172, and 1173 may be used to provide DC biasing for one or more amplifiers or other devices, or for connection of one or more tuning blocks, perhaps one of those described with respect to FIGS. 6A-6C. If a common DC biasing or amplifier block is to be connected, there may be a common connection section 1175 utilized to electrically connect the center tap ports 1171, 1172, and 1173, according to an example embodiment of the invention. Likewise, the center tap ports can also be utilized with secondary windings 1102, 1104, 1106 without departing from example embodiments of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for multiple transformers, comprising:
   a first transformer section that includes a first primary winding section and a first secondary winding, wherein the first primary winding section is inductively coupled to the first secondary winding, wherein the first transformer section is associated with a first rotational current flow direction in the first primary winding section; and
   a second transformer section that includes a second primary winding section and a second secondary winding, wherein the second primary winding section is inductively coupled to the second secondary winding, wherein the second transformer section is associated with a second rotational current flow direction opposite the first rotational current flow direction in the second primary winding section,
   wherein a first portion of the first primary winding section is adjacent to a second portion of the second primary winding section, wherein the adjacent first and second portions include a substantially same first linear current flow direction.

2. The system of claim 1, wherein the adjacent first and second portions collectively provide a shared section, wherein the shared section electrically connects the first primary winding section and the second primary winding section.

3. The system of claim 1, wherein the shared section enables current to flow from both the first primary winding section and the second primary winding section through the shared section.

4. The system of claim 1, wherein the first and second portions collectively provide the shared section by (i) overlapping the first and second portions, (ii) positioning the first and second portions adjacent to each other with zero separation distance, or (iii) being a same portion.

5. The system of claim 1, wherein the first rotational current flow direction and the second rotational current flow direction are chosen from the group consisting of (i) a clockwise current flow direction and (ii) a counterclockwise current flow direction.

6. The system of claim 1, further comprising:
a third transformer section that includes a third primary winding section and a third secondary winding, wherein the third primary winding section is inductively coupled to the third secondary winding, wherein the third transformer section is associated with the first rotational current flow direction in the third primary winding section,
wherein a third section of the third primary winding section is adjacent to a fourth section of the second primary winding section, wherein the adjacent third and fourth sections include a substantially same second linear current flow direction opposite the first linear current flow direction.

7. The system of claim 6, wherein the shared section is a first shared section, wherein the adjacent third and fourth portions collectively provide a second shared section, wherein the second shared section electrically connects the second primary winding section and the third primary winding section.

8. The system of claim 1, wherein the transformers are spiral-type transformers.

9. The system of claim 1, wherein the first and second transformer sections are operative for inter-stage matching.

10. The system of claim 1, wherein the first primary winding section, the first secondary winding, the second primary winding section, and the second secondary winding each include one or more turns.

11. The system of claim 1, wherein the first transformer section and the second transformer section are substantially symmetrical in structure.

12. The system claim 1, wherein one or more of the first primary winding section, first secondary winding, second primary winding section, and second secondary winding include center tap ports defining a virtual ground.

13. The system of claim 10, wherein one or more of the center tap ports are connected to one or more bias voltages or tuning blocks.

14. The system of claim 13, wherein the tuning blocks comprise one or more resonant circuits for enhancing or suppressing one or more frequency components.

15. The system of claim 1, wherein the first and second transformer sections are fabricated (i) on a single metal layer according to a planar structure, or (ii) on two or more metal layers according to a stacked structure.

16. A method for providing multiple transformers, comprising:
providing a first transformer section that includes a first primary winding section and a first secondary winding, wherein the first primary winding is inductively coupled to the first secondary winding, wherein the first primary winding is coupled to one or more first input ports;
receiving a first input source at the one or more first input ports to provide a first rotational current flow direction in the first primary winding;
providing a second transformer section that includes a second primary winding section and a second secondary winding, wherein the second primary winding section is inductively coupled to the second secondary winding, wherein the second primary winding is coupled to one or more second input ports;
receiving a second input source at the one or more second input ports to provide a second rotational current flow direction opposite the first rotational current flow direction in the second primary winding section; and
positioning a first portion of the first primary winding section adjacent to a second portion of the second primary winding section, wherein the adjacent first and second portions include a substantially same first linear current flow direction.

17. The method of claim 16, wherein the first rotational current flow direction and the second rotational current flow direction are chosen from the group consisting of (i) a clockwise current flow direction and (ii) a counterclockwise current flow direction.

18. The method of claim 17, wherein the adjacent first and second portions collectively provide a shared section, wherein the shared section electrically connects the first primary winding section and the second primary winding section.

19. The method of claim 17, wherein the shared section enables current to flow from both the first primary winding section and the second primary winding section through the shared section.

20. The method of claim 17, wherein the first and second portions collectively provide the shared section by (i) overlapping the first and second portions, (ii) positioning the first and second portions adjacent to each other with zero separation distance, or (iii) being a same portion.

* * * * *